(12) United States Patent
Chen et al.

(10) Patent No.: US 12,389,662 B2
(45) Date of Patent: Aug. 12, 2025

(54) FORMATION METHOD OF SHALLOW TRENCH ISOLATION

(71) Applicant: TAIWAN SEMICONDUCTOR MANUFACTURING COMPANY, LTD., Hsinchu (TW)

(72) Inventors: Szu-Ying Chen, Hsinchu (TW); Chia-Cheng Chen, Hsinchu (TW); Liang-Yin Chen, Hsinchu (TW); Sen-Hong Syue, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 607 days.

(21) Appl. No.: 17/746,450

(22) Filed: May 17, 2022

(65) Prior Publication Data

US 2023/0377999 A1   Nov. 23, 2023

(51) Int. Cl.
| | |
|---|---|
| *H10D 84/03* | (2025.01) |
| *H01L 21/02* | (2006.01) |
| *H01L 21/311* | (2006.01) |
| *H01L 21/3115* | (2006.01) |
| *H10D 30/01* | (2025.01) |
| *H10D 30/67* | (2025.01) |
| *H10D 62/10* | (2025.01) |
| *H10D 84/01* | (2025.01) |
| *H10D 84/85* | (2025.01) |

(52) U.S. Cl.
CPC ....... *H10D 84/038* (2025.01); *H01L 21/0259* (2013.01); *H01L 21/31111* (2013.01); *H01L 21/31155* (2013.01); *H10D 30/031* (2025.01); *H10D 30/6735* (2025.01); *H10D 30/6757* (2025.01); *H10D 62/118* (2025.01); *H10D 84/0167* (2025.01); *H10D 84/0188* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 9,034,706 B2 * | 5/2015 | Liu | H10D 30/024 438/300 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |

(Continued)

FOREIGN PATENT DOCUMENTS

| | | | |
|---|---|---|---|
| CN | 102254899 A | * 11/2011 | ..... H01L 21/823418 |
| CN | 103367230 A | * 10/2013 | |

(Continued)

*Primary Examiner* — Michael Lebentritt
(74) *Attorney, Agent, or Firm* — Birch, Stewart, Kolasch & Birch, LLP

(57) ABSTRACT

A method of forming a semiconductor device includes etching trenches in a substrate to form fin structures, depositing a liner layer to line the trenches, filling the trenches with an insulating layer, performing an ion implantation process to the insulating layer, after performing the ion implantation process, recessing the insulating layer to form shallow trench isolation (STI) regions adjacent the fin structures, and forming a gate crossing the fin structures.

20 Claims, 40 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2016/0079034 A1* | 3/2016 | Yieh | H01L 21/3065 |
| 2019/0067441 A1* | 2/2019 | Yang | H10D 30/43 |
| 2020/0006154 A1* | 1/2020 | Chiang | H10D 30/43 |
| 2020/0052086 A1* | 2/2020 | Yang | H10D 30/43 |
| 2020/0227570 A1* | 7/2020 | Chen | B82Y 10/00 |
| 2022/0238660 A1* | 7/2022 | Huang | H01L 21/7624 |

FOREIGN PATENT DOCUMENTS

| | | | | |
|---|---|---|---|---|
| CN | 106898649 A | * | 6/2017 | H01L 21/2236 |
| CN | 109087859 A | * | 12/2018 | H01L 29/0847 |
| CN | 113488387 A | * | 10/2021 | G03F 1/00 |
| CN | 113745166 A | * | 12/2021 | H01L 21/02164 |
| TW | 202303773 A | * | 1/2023 | B82Y 10/00 |

* cited by examiner

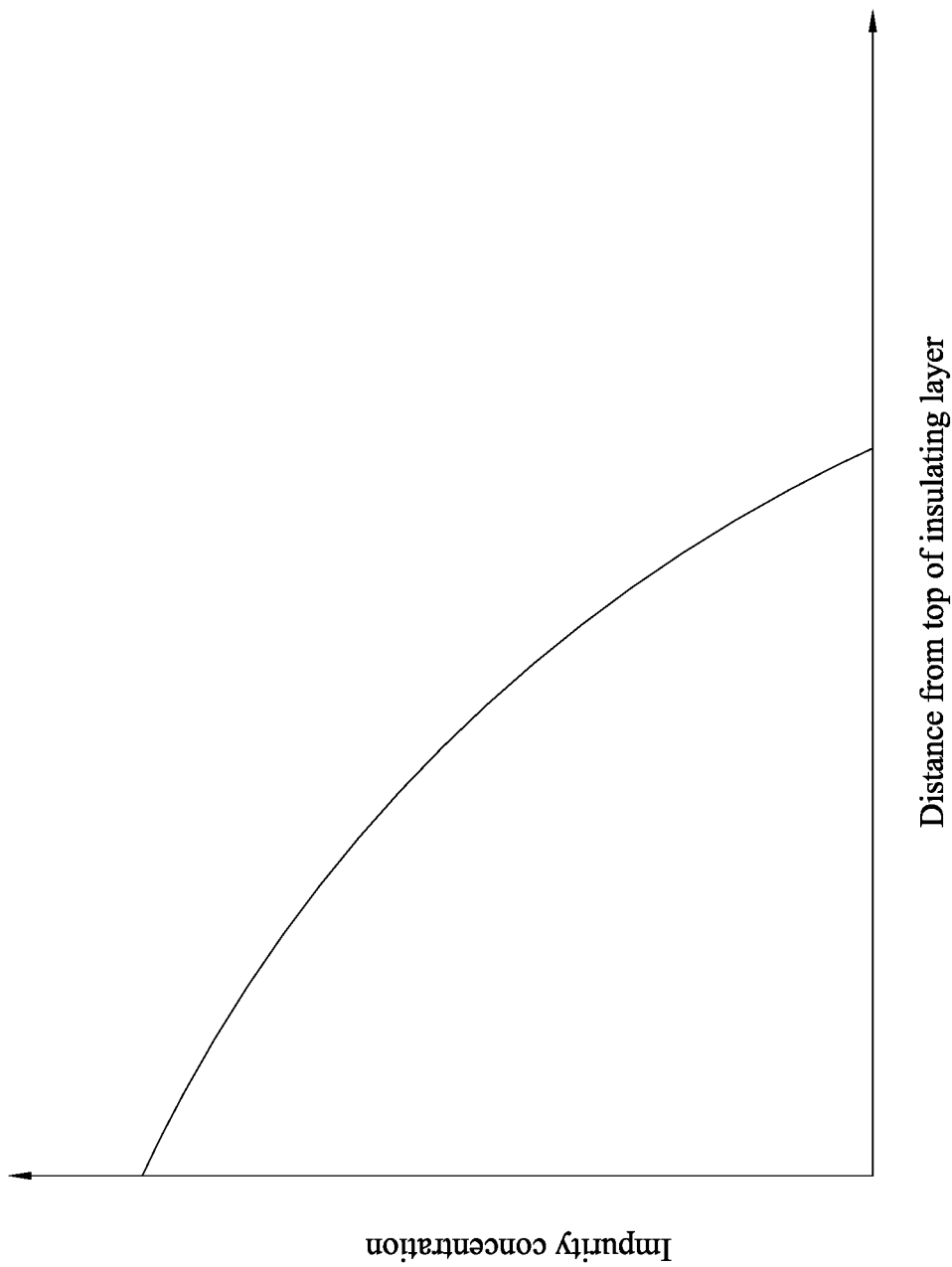

FORMATION METHOD OF SHALLOW TRENCH ISOLATION

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6B is a graph illustrating an impurity concentration in the insulating layer as a function of a distance from a top of the insulating layer.

DETAILED DESCRIPTION

Figure 1:
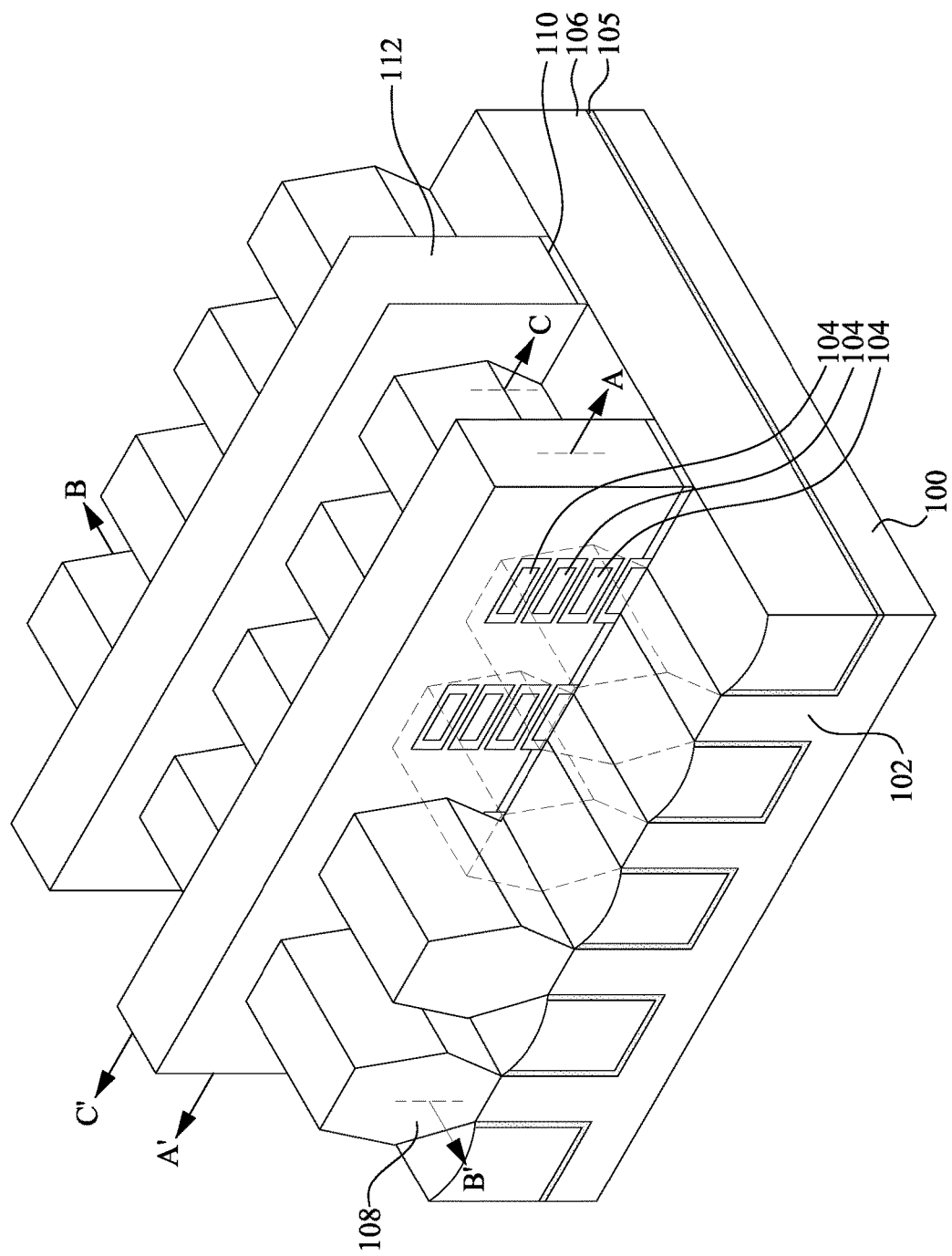
FIG. 1 illustrates an example of gate-all-around field-effect transistors (GAA-FETs) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating gate-all-around (GAA) transistors having different high-k gate dielectric compositions. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as fin field effect transistors (FinFET), on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In transistors, shallow trench isolations (STIs) are used to separate and isolate active areas on a semiconductor wafer from each other. STIs may be formed by etching trenches, overfilling the trenches with a dielectric layer such as oxide, and then removing any excess dielectric with a process such as chemical mechanical polishing (CMP) or etching in order to remove the dielectric outside trenches. A liner layer (e.g., oxide) is used to line the trenches for the STIs to protect the underlying substrate from subsequent process. For example, the liner layer may be made of a dense film using physical vapor deposition to shield the underlying substrate from oxidation chemistry in subsequent processing. By contrast, the STIs may be formed by a flowable chemical vapor deposition process to enhance a gap fill capability. The SIT oxide formed from flowable deposition has a faster etch rate than the liner oxide formed from PVD. Such etch rate difference leads to "dishing effect" of the STIs in an STI etch back process, which means the resultant STIs may have a smaller thickness at central regions of STIs than at peripheral regions of STIs.

Therefore, the present disclosure in various embodiments reduces an etch rate of the STIs by using an ion implantation process. For example, the ions can introduce additional atoms and breaking Si—O bonding in the STIs, both of which result in an enhanced etch resistance for the STIs.

FIG. 1 illustrates an example of GAA-FETs (e.g., nanowire FETs, nanosheet FETs, or the like) in a three-dimensional view, in accordance with some embodiments. The GAA-FETs comprise nanostructures 104 (e.g., nanosheets, nanowires, nanorings, nanoslabs, or other structures having nanoscale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. A liner layer 105 is formed between the isolation regions 106 and the fins 102. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106.

Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectric 110 and the gate electrodes 112.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 108 of a GAA-FET. Cross-section B-B' is perpendicular to cross-section A-A' and is parallel to a longitudinal axis of a fin 102 of the GAA-FET and in a direction of, for example, a current flow between the epitaxial source/drain regions 108 of the GAA-FET. Cross-section C-C' is parallel to cross-section A-A' and extends through epitaxial source/drain regions of the GAA-FETs. Subsequent figures refer to these reference cross-sections for clarity.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 2, 3, 13, 14A, 21A, 22A, 23A, 24A and 25A are cross-sectional views at intermediate fabrication stages, illustrating reference cross-section A-A' illustrated in FIG. 1 that extends through a gate region along a longitudinal axis of the gate region. FIGS. 4-7B are three-dimensional views at intermediate fabrication stages, in accordance with some embodiments. FIGS. 14B, 15B, 16B, 17B, 18B, 19B, 20B, 21B, 22B, 23B, 23C, 24B and 25B are cross-sectional views at intermediate fabrication stages, illustrating reference cross-section B-B' illustrated in FIG. 1 that extends through a fin along a longitudinal axis of the fin. FIGS. 15A, 16A, 17A, 18A, 19A, 20A, 20C, 21C are cross-sectional views at intermediate fabrication stages, illustrating reference cross-section C-C' illustrated in FIG. 1 that extends through source/drain regions along the longitudinal direction of the gate region.

Figure 2:
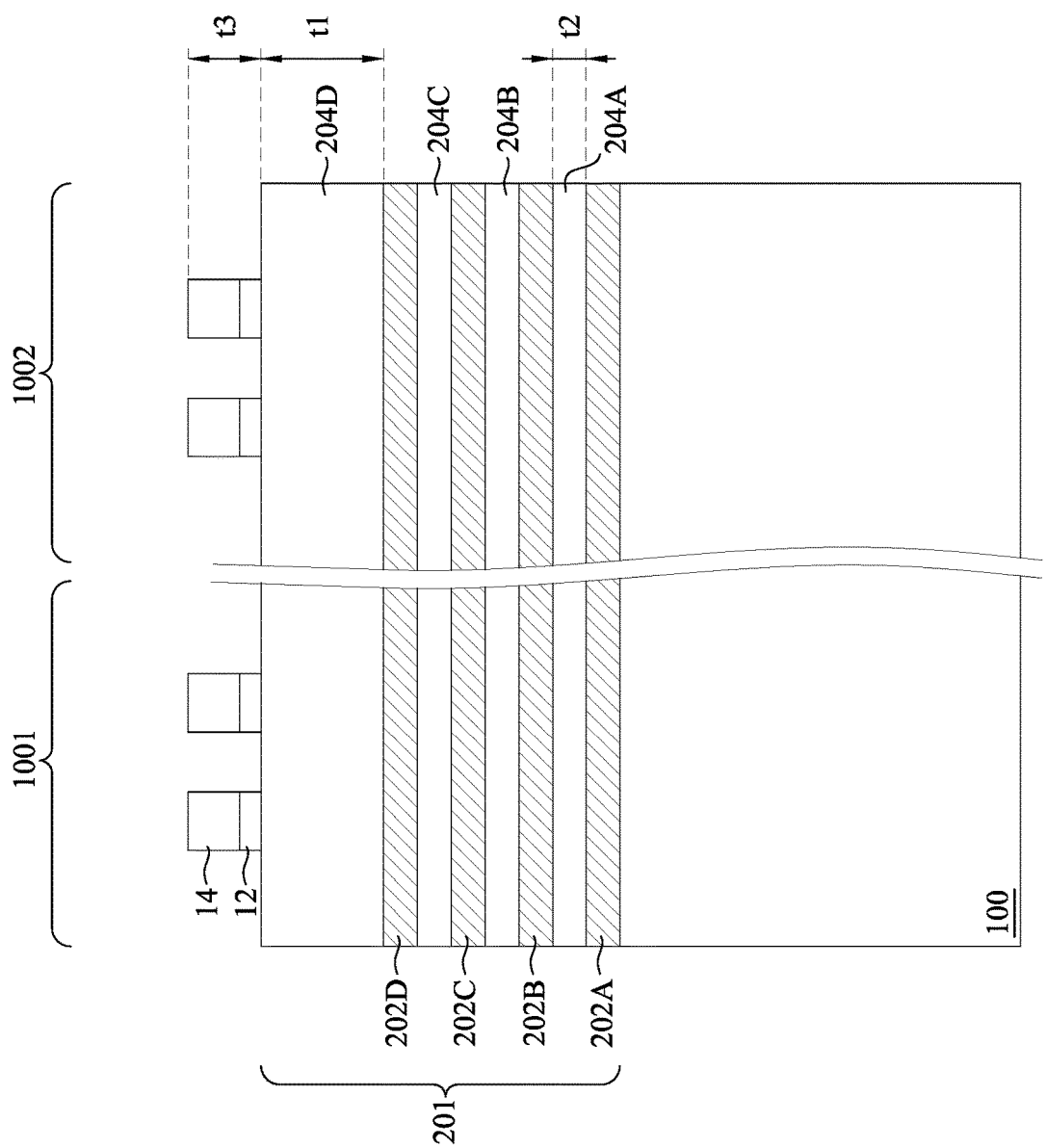
FIGS. 2, 3, 13, 14A, 21A, 22A, 23A, 24A and 25A are cross-sectional views at intermediate fabrication stages, illustrating reference cross-section A-A' illustrated in FIG. 1 that extends through a gate region along a longitudinal axis of the gate region.

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has a first device region 1001 and a second region 1002. The first device region 1001 is a region in which first transistors will reside, and the second device region 1002 is a region in which second transistors will reside. In some embodiments, the first transistors are different from the second transistors at least in threshold voltage. For example, first transistors in the first device region 1001 may be High Voltage (HV) devices (e.g., I/O devices), and second transistors in the second device region 1002 may be Low Voltage (LV) devices (e.g., logic devices). In some other embodiments, the first transistors are different from the second transistors at least in conductivity type. For example, the first device region 1001 can be for forming n-type devices, such as n-channel metal-oxide-semiconductor (NMOS) transistors, e.g., n-type GAA-FETs, and the second device region 1002 can be for forming p-type devices, such as p-channel metal-oxide-semiconductor (PMOS) transistors, e.g., p-type GAA-FETs.

The first device region 1001 may be separated from the second device region 1002, and any number of device features (e.g., other active devices, doped regions, isolation structures, etc.) may be disposed between the first device region 1001 and the second device region 1002. Although one first device region 1001 and one second device region 1002 are illustrated, any number of first device regions 1001 and second device regions 1002 may be provided.

Further in FIG. 2, a multi-layer stack 201 is formed over the substrate 100. The multi-layer stack 201 includes alternating layers of first semiconductor layers 202A-D (collectively referred to as first semiconductor layers 202) and second semiconductor layers 204A-D (collectively referred to as second semiconductor layers 204). For purposes of illustration and as discussed in greater detail below, the first semiconductor layers 202 will be removed and the second semiconductor layers 204 will be patterned to form channel regions of GAA-FETs.

The first semiconductor layers 202 and the second semiconductor layers 204 may include one or more layers of Si, Ge, SiGe, GaAs, InSb, GaP, GaSb, InAlAs, InGaAs, GaSbP, GaAsSb or InP. In some embodiments, the first semiconductor layers 110 and the second semiconductor layers 112 are made of Si, a Si compound, SiGe, Ge or a Ge compound. The first semiconductor layers 202 include a first composition and the second semiconductor layers 204 include a second composition different from the first composition. The first and second compositions have different oxidation rates and/or etch selectivity. For example, the first semiconductor layers 202 may include SiGe and the second semiconductor layers 204 may include Si.

The multi-layer stack 201 is illustrated as including four layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of GAA-FETs.

The topmost second semiconductor layer 204D can function as a dummy semiconductor layer or sacrificial layer to protect the channel regions of GAA-FETs from being damaged during a subsequent ion implantation process and has a thickness different from other second semiconductor layers 204A-204C. For example, the topmost second semiconductor layer 204D has a thickness t1 greater than the thicknesses t2 of the second semiconductor layers 204A-204C. In some embodiments, the topmost first semiconductor layer 202D has the thickness t1 in a range from 35 nm to 45 nm.

A Pad layer 12 and a mask layer 14 may be formed on the multi-layer stack 201. The pad layer 12 may be a thin film comprising silicon oxide formed, for example, using a thermal oxidation process. The pad layer 12 may act as an adhesion layer between multi-layer stack 201 and the mask layer 14. The pad layer 12 may also act as an etch stop layer for etching the mask layer 14. In an embodiment, the mask layer 14 is formed of silicon nitride, for example, using low-pressure chemical vapor deposition (LPCVD). In other embodiments, the mask layer 14 is formed by thermal nitridation of silicon, plasma enhanced chemical vapor deposition (PECVD), or plasma anodic nitridation. The mask layer 14 is used as a hard mask during subsequent photolithography processes. A photo resist (not shown) is formed on the mask layer 14 and is then patterned, forming openings in the photo resist. In some embodiments, the pad layer and the mask layer 14 collectively have a height in a range from 25 nm to 30 nm.

Figure 3:
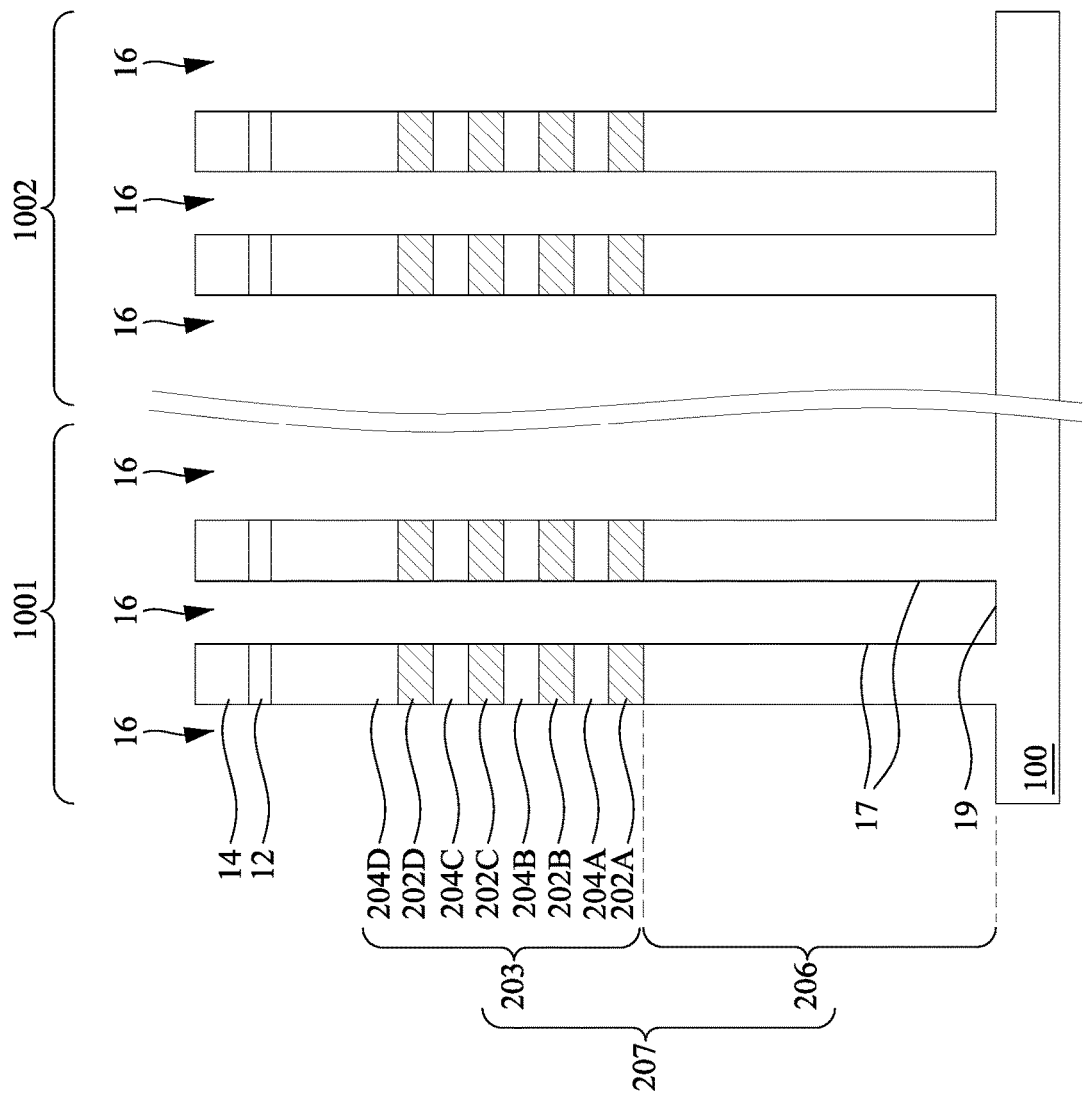

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches 16 in the multi-layer stack 201 and the substrate 100 using the mask layer 14 and the pad layer 12 as an etch mask. Each fin structure 206 and overlying nanostructures 203 can be collectively referred to as a fin 207 extending from the substrate 100. The trenches 16 separate neighboring nanostructures 203 and neighboring fin structures 206. The trenches 16 have sidewalls 17 and a bottom surface 19. The etching may be any acceptable etch process, such as a reactive ion etch (RIE), neutral beam etch (NBE), the like, or a combination thereof. The etching may be anisotropic. Forming the nanostructures 203 by etching the multi-layer stack 201 may further define first nanostructures 202A-D (collectively referred to as the first nanostructures 202) from the first semiconductor layers 202 and define second nanostructures 204A-D (collectively referred to as the second nanostructures 204) from the second semiconductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206.

FIG. 3 illustrates the fin structures 206 in the first device region 1001 and the second device region 1002 as having substantially equal widths for illustrative purposes. In some embodiments, widths of the fin structures 206 in the first device region 1001 may be greater or thinner than the fin structures 206 in the second device region 1002. Further, while each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostructures 203 continuously increases in a direction towards the substrate 100. In such embodiments, each of the nanostructures 203 may have a different width and be trapezoidal in shape.

The process described above with respect to FIGS. 2 and 3 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting nanostructures 202) and the second semiconductor layers (and resulting nanostructures 204) are illustrated and discussed herein as comprising the same materials in the second device region 1002 and the first device region 1001 for illustrative purposes only. As such, in some embodiments one or both of the first semiconductor layers and the second semiconductor layers may be different materials or formed in a different order in the first and second device regions 1001 and 1002.

Figure 4:
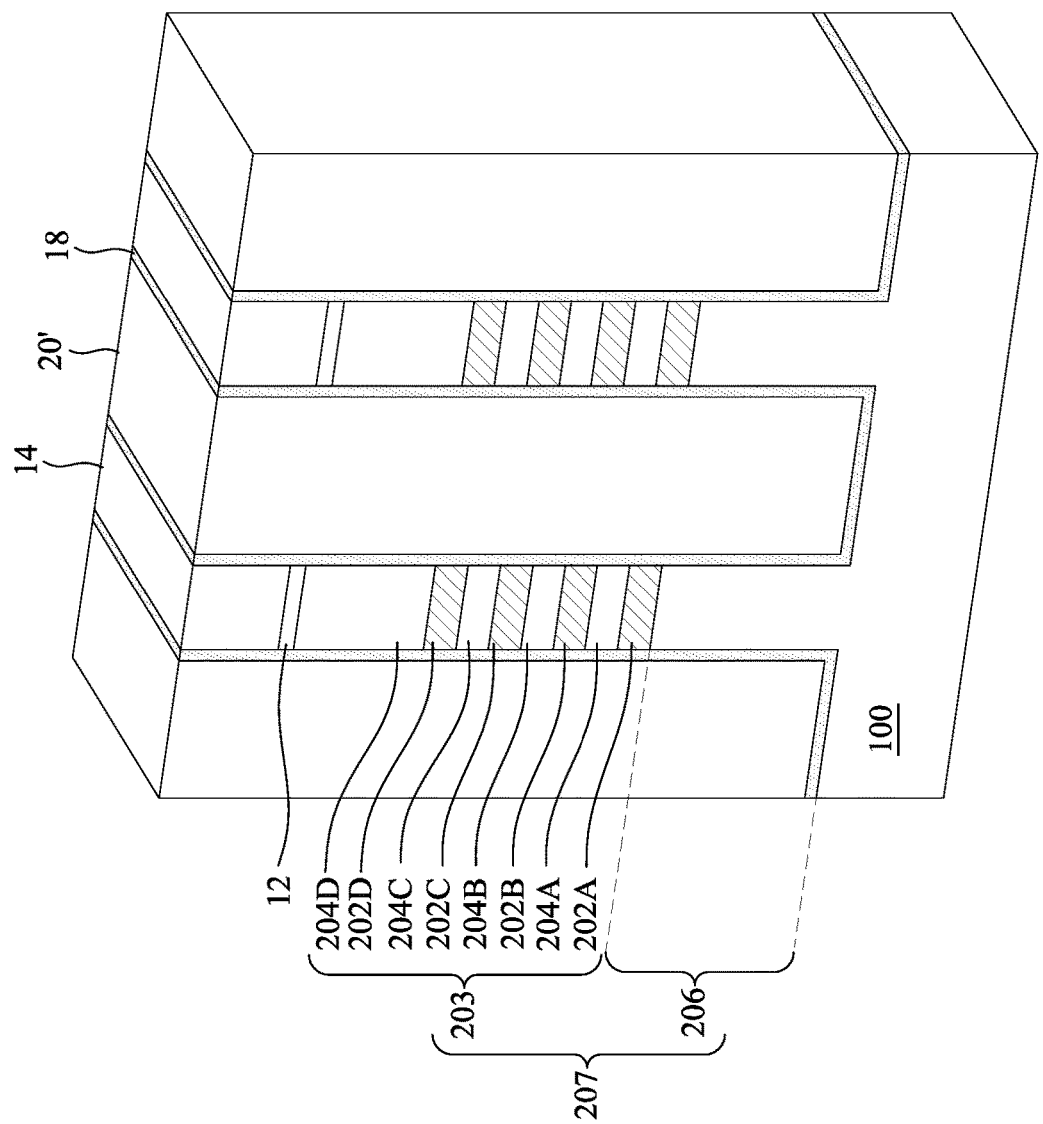
FIGS. 4, 5, 6A, 7A and 7B are three-dimensional views at intermediate fabrication stages, in accordance with some embodiments.

A liner layer 18 and an insulating layer 20' are deposited sequentially to line the trenches 16 in accordance with some embodiments. The liner layer is a conformal layer and is deposited on sidewalls 17 and the bottom surface 19 of the trenches 16. After the deposition of the liner layer 18, the insulating layer overfills the trench 16 and is over the mask layer 14. A planarization process is performed to remove the insulating layer 20' and the liner layer 18 outside the trenches 16, as shown in FIG. 4. In some embodiments, the planarization process is a chemical mechanical polishing (CMP) process.

The liner layer 18 and the insulating layer 20' may be formed using different deposition methods. For example, the liner layer 18 may be deposited using physical vapor deposition (PVD) and may include silicon oxide, silicon nitride, silicon oxynitride or a combination thereof. The insulating layer 20' may be deposited using flowable CVD (FCVD) and after the insulating layer 20' is deposited, an anneal/curing step is performed, which converts the insulating layer 20' from a flowable material into a solid material. Such difference in the formation methods between the liner layer 18 and the insulating layer 20' cause the liner layer 18 and the insulating layer 20' having different etch rates to the etchants of a subsequent recessing process, leading to potential dishing effect in the insulating layer 20' in a subsequent etch back process.

Figure 5:
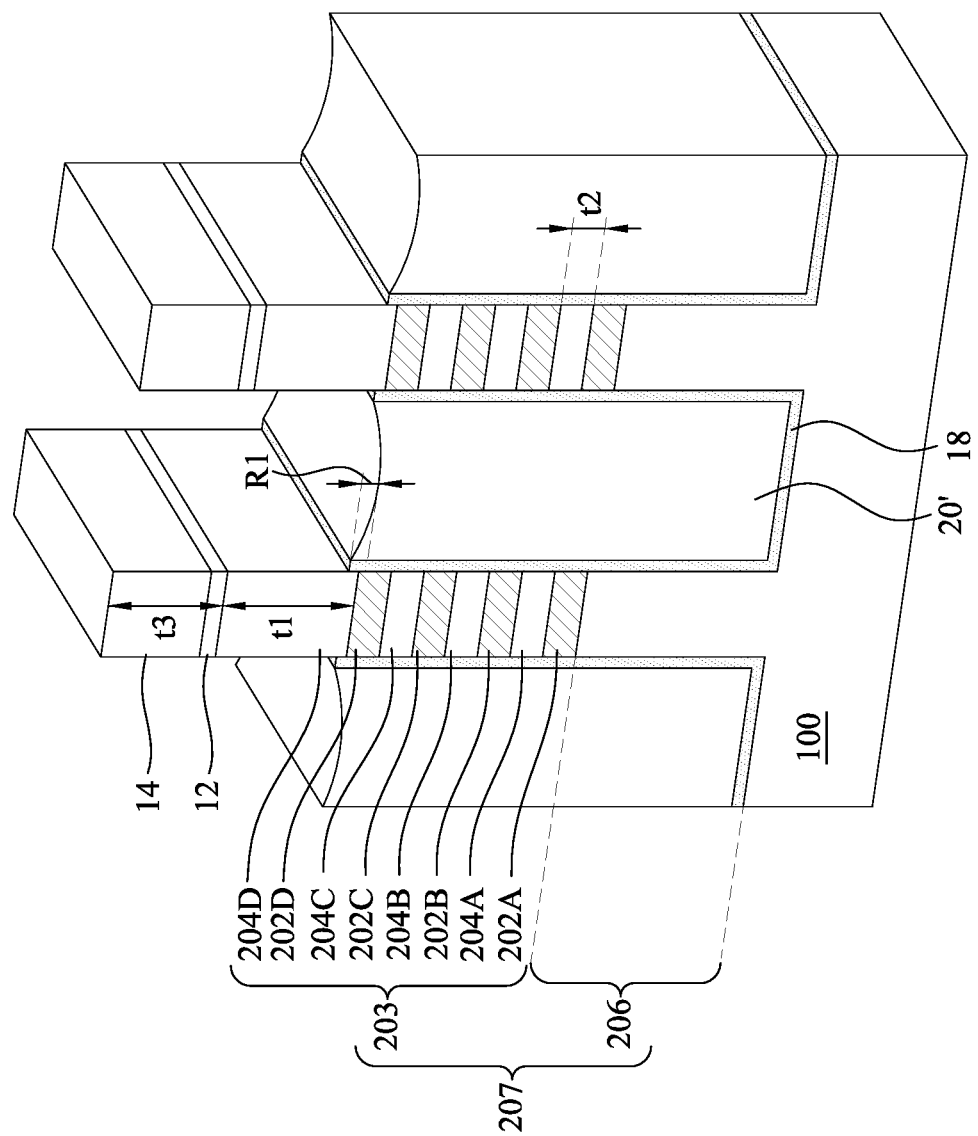

Referring to FIG. 5, a first recessing process (e.g., etch back process) is performed to remove a first portion of the liner layer 18 and a first portion of the insulating layer 20'. The first recessing process is stopped when a bottom of the topmost second semiconductor layer 204D is exposed. As discussed previously with regard to FIG. 2, the topmost layer of the second nanostructures 204 (i.e., the second nanostructure 204D) can function as a dummy semiconductor layer or sacrificial layer to protect the channel regions of GAA-FETs from being damaged during a subsequent ion implantation process and has a thickness t3 different from the thicknesses t2 of the other second semiconductor layers 204A-204C, for example, greater than the thickness t2 of a bottommost layer of the second nanostructures 204 (i.e., the second nanostructure 204A). After etching the insulating layer 20', the insulating layer 20' remains covering a topmost layer of the first nanostructures 202 (i.e., the topmost first semiconductor layer 202D).

The first recessing process may result in the dishing effect in the insulating layer 20'. For example, the insulating layer 20' has a concave top surface. The dishing effect may cause a recessed depth R1 in a top surface of the insulating layer 20'. The recessed depth R1 is height difference between a lowest position of the top surface of the insulating layer 20' and a highest position of the top surface of the insulating layer 20', wherein the lowest position is in the vicinity of a central region of the insulating layer 20', and the highest position is in the vicinity of the boundary between the insulating layer 20' and the liner layer 18. For example, the recessed depth R1 is from 0.5 nm to 1.5 nm. In other words, the first recessing process is performed such that the insulating layer 20 has a top surface recessed into the insulating layer 20' having a maximum depth R1 in a range from 0.5 nm to 1.5 nm.

Figure 6A:
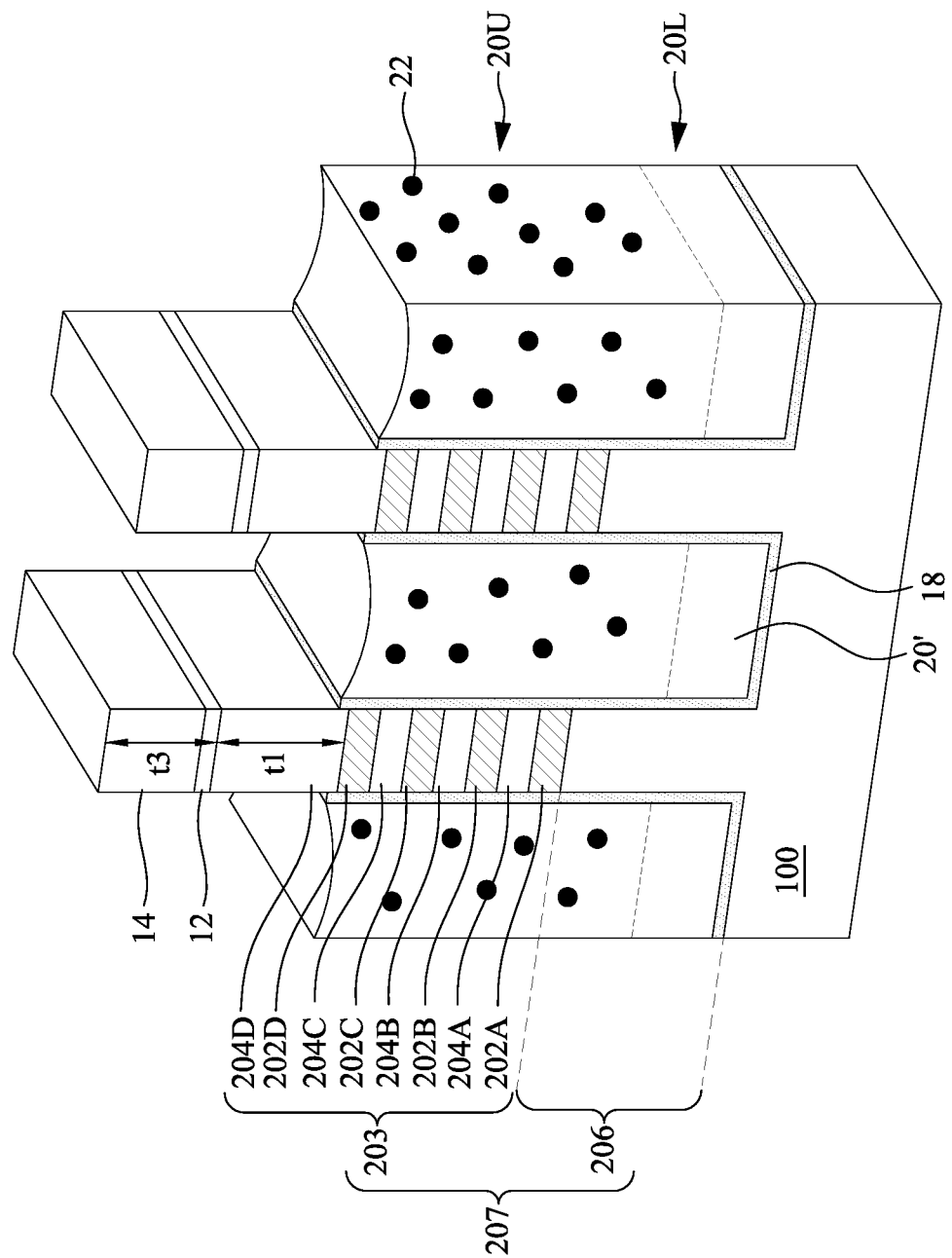

Referring to FIG. 6A, an ion implantation process is performed to introduce impurities 22 such as Si, He and/or N atoms into the insulating layer 20'. In some embodiments, the ion implantation process is performed to introduce the impurities 22 into an upper portion 20U of the insulating layer 20' without introducing impurities 22 into a lower portion 20L of the insulating layer 20'. The ion implantation process has an implant depth in a range from 30 nm to 50 nm. The ion implantation is used to reduce an etch rate of the insulating layer 20'. For example, by using the ion implantation process, the insulating layer 20' can have additional atoms (e.g., the impurities 22) therein and thus can have an increased density. Therefore, the insulating layer 20' can be more robust against the etchant in a subsequent second recessing process (see FIGS. 7A-7B). In some embodiments, the insulating layer 20' may be made of silicon oxide, silicon nitride, silicon oxynitride or a combination thereof, and may include Si—O bonding, Si—N bonding, Si—Si bonding or a combination thereof. In some embodiments where the ions include N, the ion implantation process allows formation of Si—N bonding such that a total amount of the Si—N bonding in the insulating layer 20 can be increased. In some embodiments where the ions include Si, the ion implantation process allows formation of Si—Si bonding such that a total amount of the Si—Si bonding can be increased. The Si—O bonding in the insulating layer 20 can be broken by the ions during the ion implantation process. It is noted that the Si—N bonding and the Si—Si bonding have etch rates less than an etch rate of the Si—O bonding. By increasing amounts of the Si—Si bonding and the Si—N bonding, the insulating layer 20 can have reduced etch rate.

In some embodiments, ion implantation process may result in the insulating layer 20' having an impurity concentration gradient. In other words, a gradient in impurity concentration may be generated in the insulating layer 20. For example, the insulating layer 20 have an impurity concentration decreasing in a direction toward the substrate 100. FIG. 6B is a graph illustrating an example impurity concentration in the insulating layer 20' as a function of a distance from a top of the insulating layer 20'. As illustrated in FIG. 6B, the ion implantation process performed to the insulating layer 20' may create a Gaussian distribution or a complementary error function distribution of impurities (e.g., Si, N, He) in the insulating layer 20'.

Figure 8:
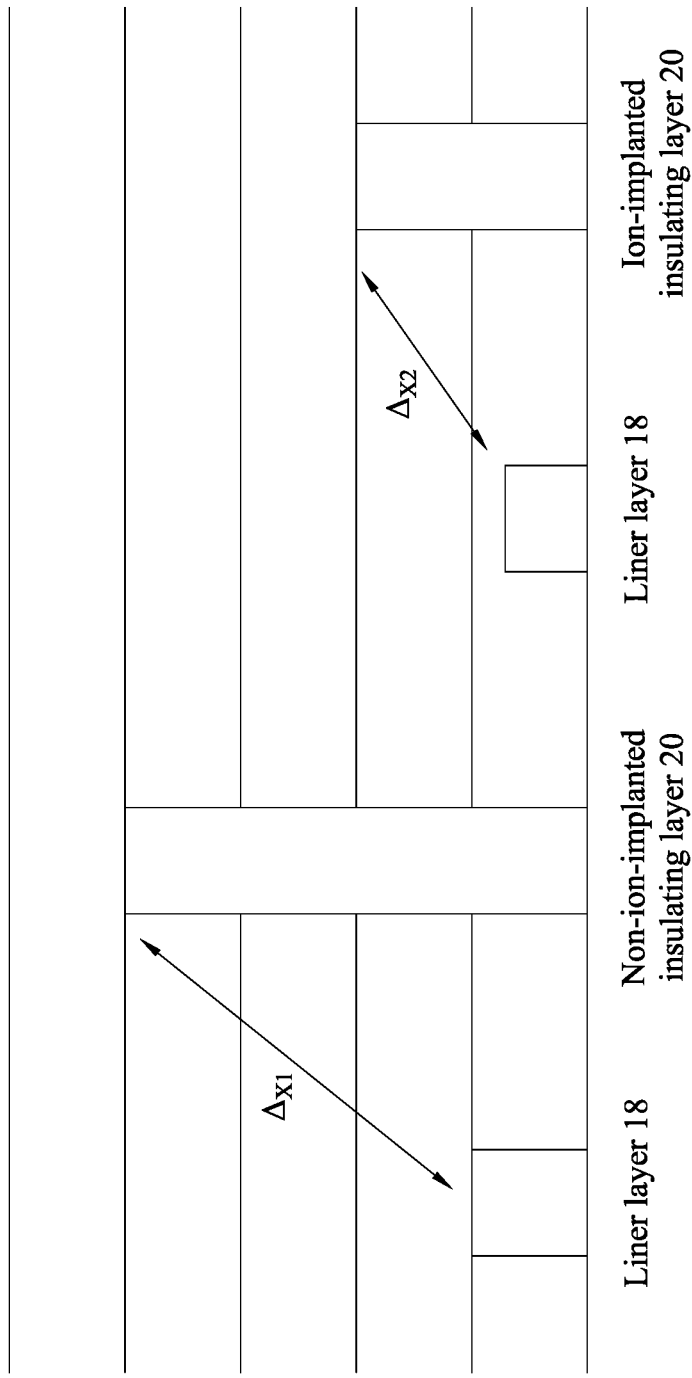
FIG. 8 is a bar chart illustrating etch rates over the liner layer and the non-ion implanted/ion-implanted insulating layers in various embodiments constructed according to various aspects of the present disclosure.

FIG. 8 is a bar chart illustrating etch rates over the liner layer 18 and the non-ion implanted/ion-implanted insulating layers 20 in various embodiments constructed according to various aspects of the present disclosure. As shown in FIG. 8, it is identified that the non-ion-implanted insulating layer 20' and the liner layer 18 have a first etch rate difference $\Delta_{X1}$ and the ion-implanted insulating layer 20' and the liner layer 18 have a second etch rate difference $\Delta_{X2}$ less than the first etch rate difference $\Delta_{X1}$.

Figure 9:
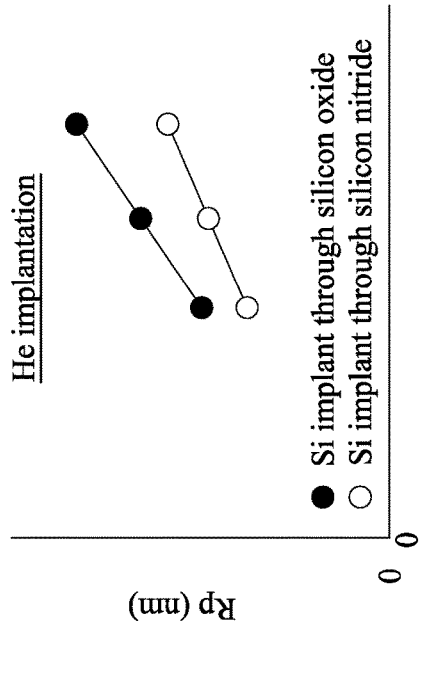
FIGS. 9-11 illustrate diagrams of penetration depths versus energy performed during the ion implantation.
Figure 10:
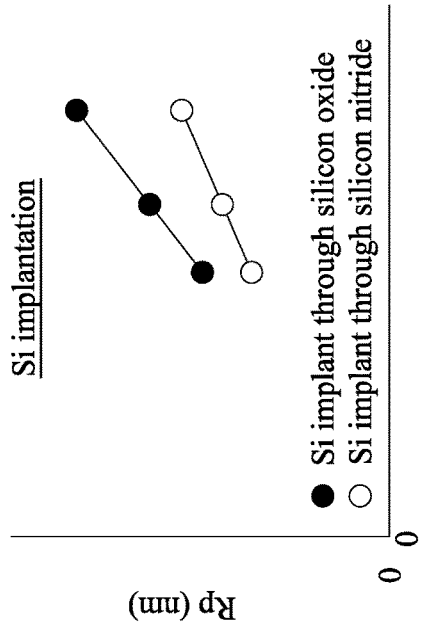
Figure 11:
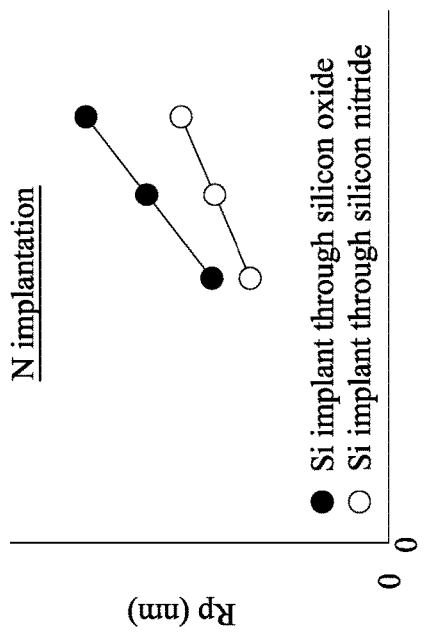

FIGS. 9-11 illustrate diagrams of penetration depths versus energy performed during the ion implantation. As discussed previously, the insulating layer 20' may include silicon oxide, silicon nitride, silicon oxynitride or a combination thereof. In FIGS. 9-11, penetration depths of Si atoms, He atoms and N atoms in silicon oxide and silicon nitride are illustrated, respectively. Referring back to FIG. 6A, in some embodiments where the mask layer 14 is made of silicon nitride, the impurities 22, such as Si, He and/or N, may be introduced into the mask layer 14. Reference is made to FIGS. 6A and 9-11. Since penetration depths of the Si atoms, He atoms and N atoms in the silicon nitride are smaller than penetration depths in the silicon oxide, the penetration depth of the impurities 22 in the mask layer 14 may be smaller than a penetration depth in the insulating layer 20' made of silicon oxide.

In some embodiments where the impurities include Si atoms, the ion implantation process may be performed at an energy in a range from 15 eV to 35 eV to control the penetration depth of the Si atoms in a range from 30 nm to 50 nm. In some embodiments where the impurities include He atoms, the ion implantation process may be performed at an energy in a range from 2.5 eV to 4.5 eV to control the penetration depth of the Si atoms in a range from 30 nm to 50 nm. In some embodiments where the impurities include N atoms, the ion implantation process may be performed at an energy in a range from 10 eV to 16 eV to control the penetration depth of the Si atoms in a range from 30 nm to 50 nm. The ion implantation process may further include implanting dopants at a dose in a range from about $2\times10^{14}$ atoms/cm$^2$ to about $2\times10^{15}$ atoms/cm$^2$, according to another embodiment. The ion implantation process may be carried out at a temperature in a range from room temperature to 450° C.

Figure 7A:
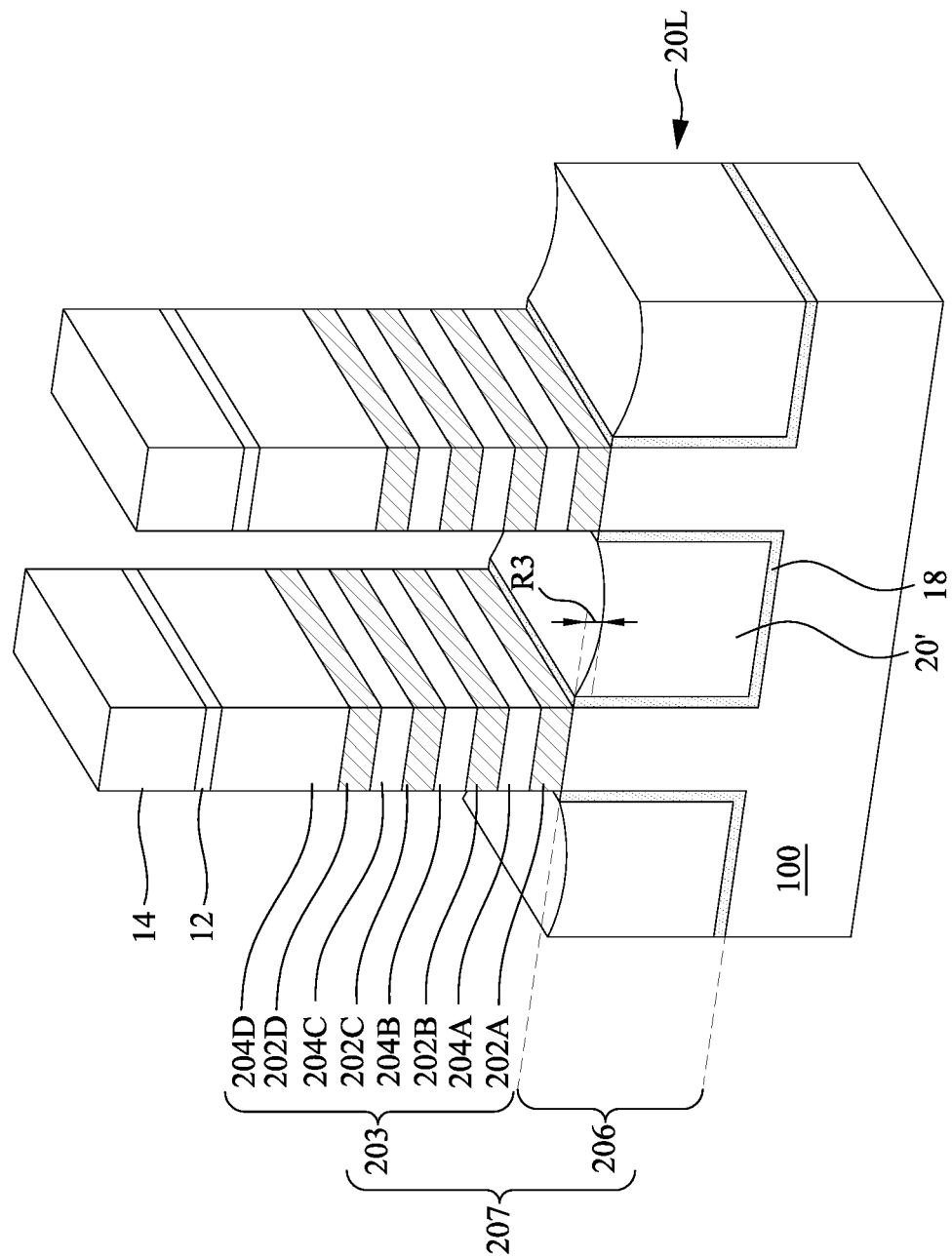
Figure 7B:
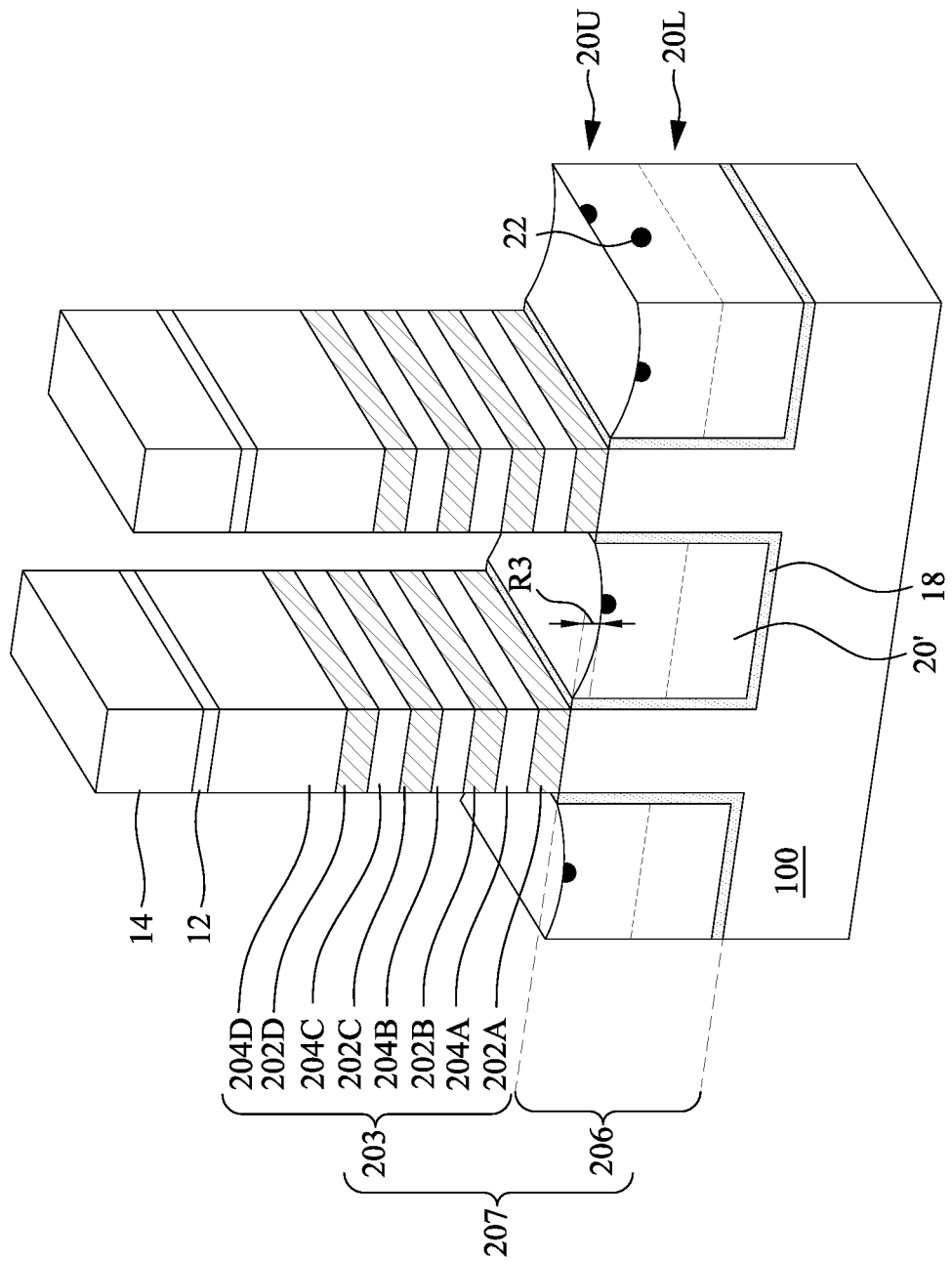

Referring back to FIG. 7A, a second recessing process (e.g., etch back process) is performed to remove a second portion of the liner layer 18 and a second portion of the insulating layer 20' to form the STI regions 20 adjacent the fin structures 206. The second recessing process is performed after the ion implantation process. Due to the reduced etch rate of the insulating layer 20', the dishing effect of the STI regions 20 is mitigated. In FIG. 7A, the dishing effect may cause a recessed depth R3 in a top surface of the insulating layer 20'. For example, the depth R3 is less than 5 nm, such as in a range from 1 nm to 4 nm. In other words, the STI regions 20 have a top surface recessed into the STI regions 20 with the maximum depth R3, which is less than 5 nm, such as in a range from 1 nm to 4 nm. The second recessing process is performed until the bottommost first semiconductor layer 202A is exposed. In some embodiments, the second recessing process uses a same etchant as the first recessing process, but takes a longer etch duration than the first recessing process. In FIG. 7A, the upper portion 20U of the insulating layer 20', which comprises the impurities 22, are totally removed after the second recessing process and only the lower portion 20L of the insulating layer 20', which does not comprise the impurities 22 are left. In an alternative embodiment, the upper portion 20U of the insulating layer 20' may partially remain over the lower portion 20L of the insulating layer 20' after the second recessing process, as shown in FIG. 7B. The upper portion 20U has impurities 22 while the lower portion 20L does not have impurities 22. Therefore, the resulting STI regions 20 have an impurity concentration gradient.

Figure 12:
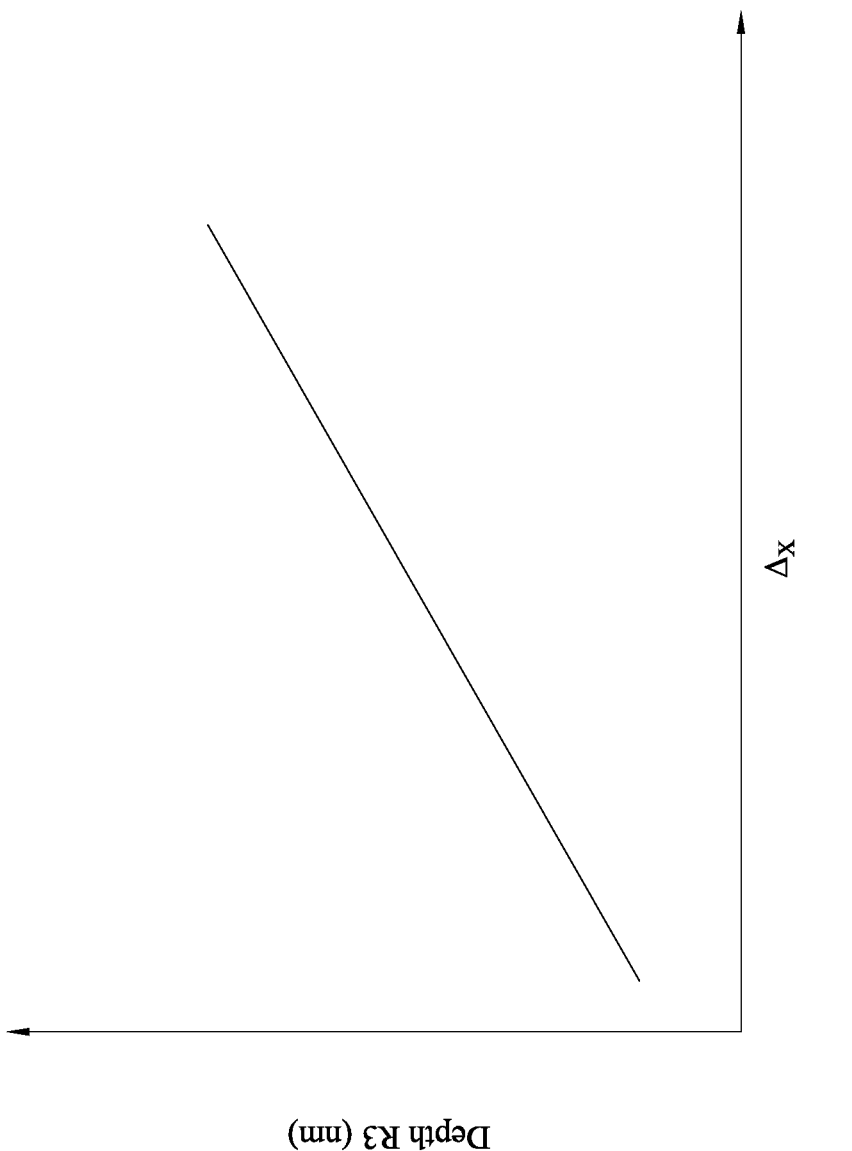
FIG. 12 shows a diagram of depth R3 versus the etch rate difference between the liner layer and the insulating layer in accordance with some embodiments.

FIG. 12 shows a diagram of depth R3 versus the etch rate difference $\Delta_X$ between the liner layer 18 and the insulating layer 20' in accordance with some embodiments. As shown in FIG. 12, there is positive correlation between the depth R3 and the etch rate difference $\Delta_X$. By reducing the etch rate difference $\Delta\Delta_X$ therebetween, the depth R3 of dishing can be reduced.

Further in FIG. 7A, appropriate wells (not separately illustrated) may be formed in the fin structures 206, the nanostructures 203, and/or the STI regions 20. In some embodiments with different well types in different device regions 1001 and 1002, different implant steps for the first device region 1001 and the second device region 1002 may be achieved using a photoresist or other masks (not separately illustrated). For example, a photoresist may be formed over the fin structures 206 and the STI regions 20 in the first device region 1001 and the second device region 1002. The photoresist is patterned to expose the second device region 1002. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the second device region 1002, and the photoresist may act as a mask to substantially prevent the first impurities from being implanted into the first device region 1001. After the implant, the photoresist is removed, such as by an acceptable ashing process.

Following or prior to the implanting of the second device region 1002, a photoresist or other masks (not separately illustrated) is formed over the fin structures 206, the nanostructures 203, and the STI regions 20 in the first device region 1001 and the second device region 1002. The photoresist is then patterned to expose the first device region 1001. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the first device region 1001, and the photoresist may act as a mask to substantially prevent p-type impurities from being implanted into the second device region 1002. After the implant, the photoresist may be removed, such as by an acceptable ashing process.

After one or more well implants of the first device region 1001 and the second device region 1002, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 13:
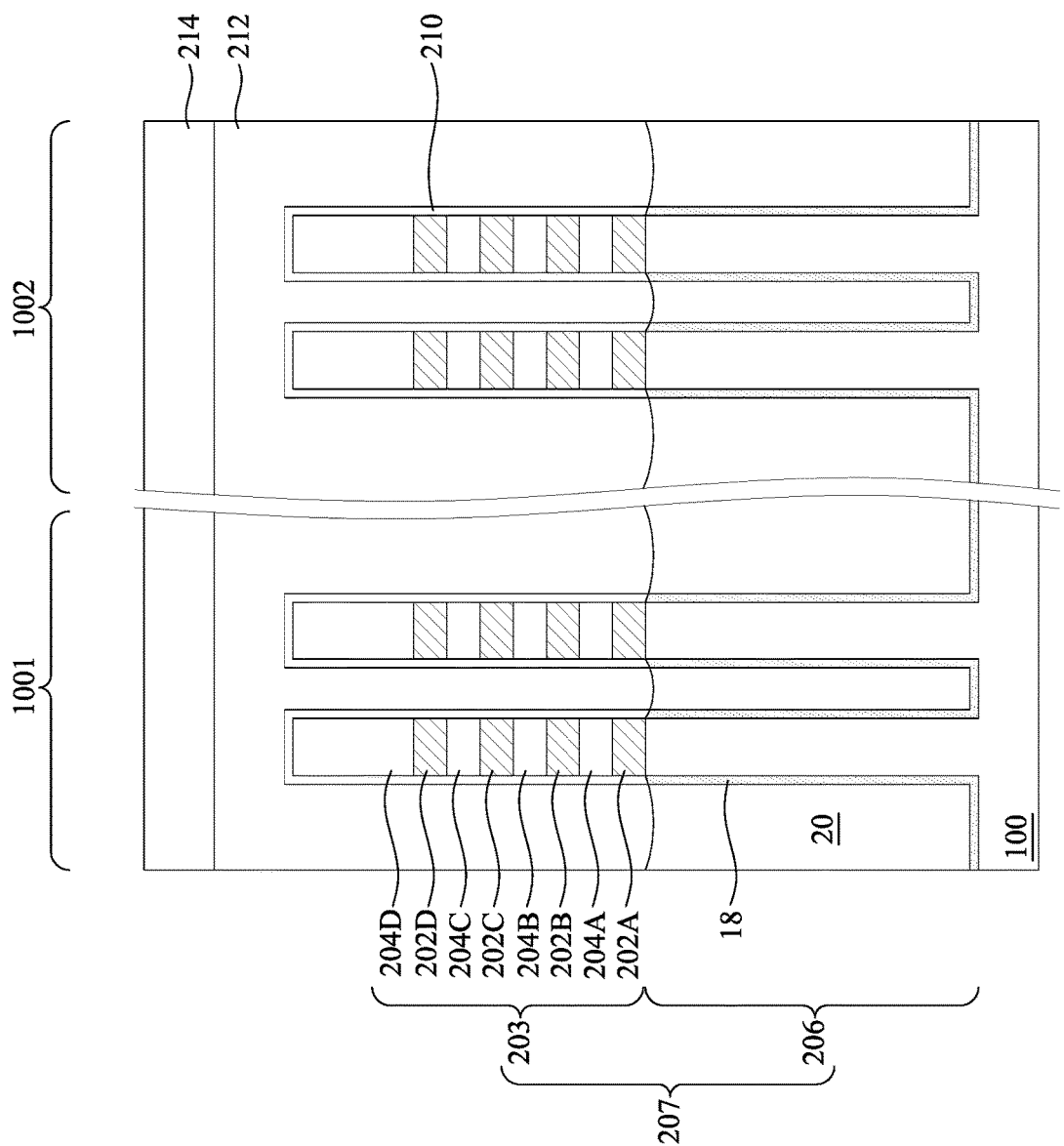

After the second recessing process, the mask layer 14 and the pad layer 12 are removed by using suitable etching process(s). A dummy gate dielectric layer 210 is formed on the fin structures 206 and/or the nanostructures 203, as shown in FIG. 13. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 212 may be deposited PVD, CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. In this example, a single dummy gate layer 212 and a single mask layer 214 are formed across the first device region 1001 and the second device region 1002. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 20 and the liner layer 18, such that the dummy dielectric layer 210 extends between the dummy gate layer 212 and the STI regions 20.

Figure 14A:
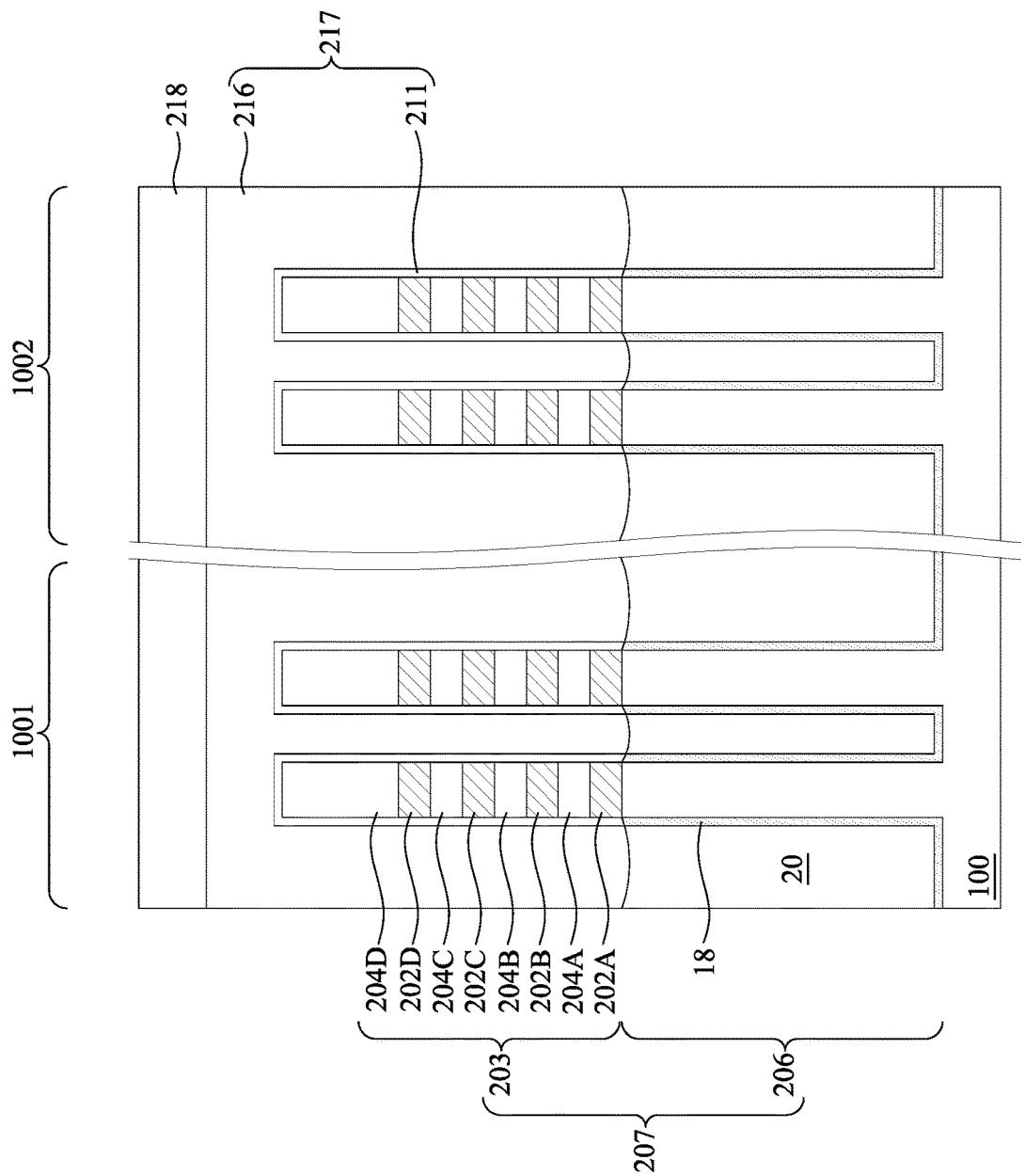
Figure 14B:
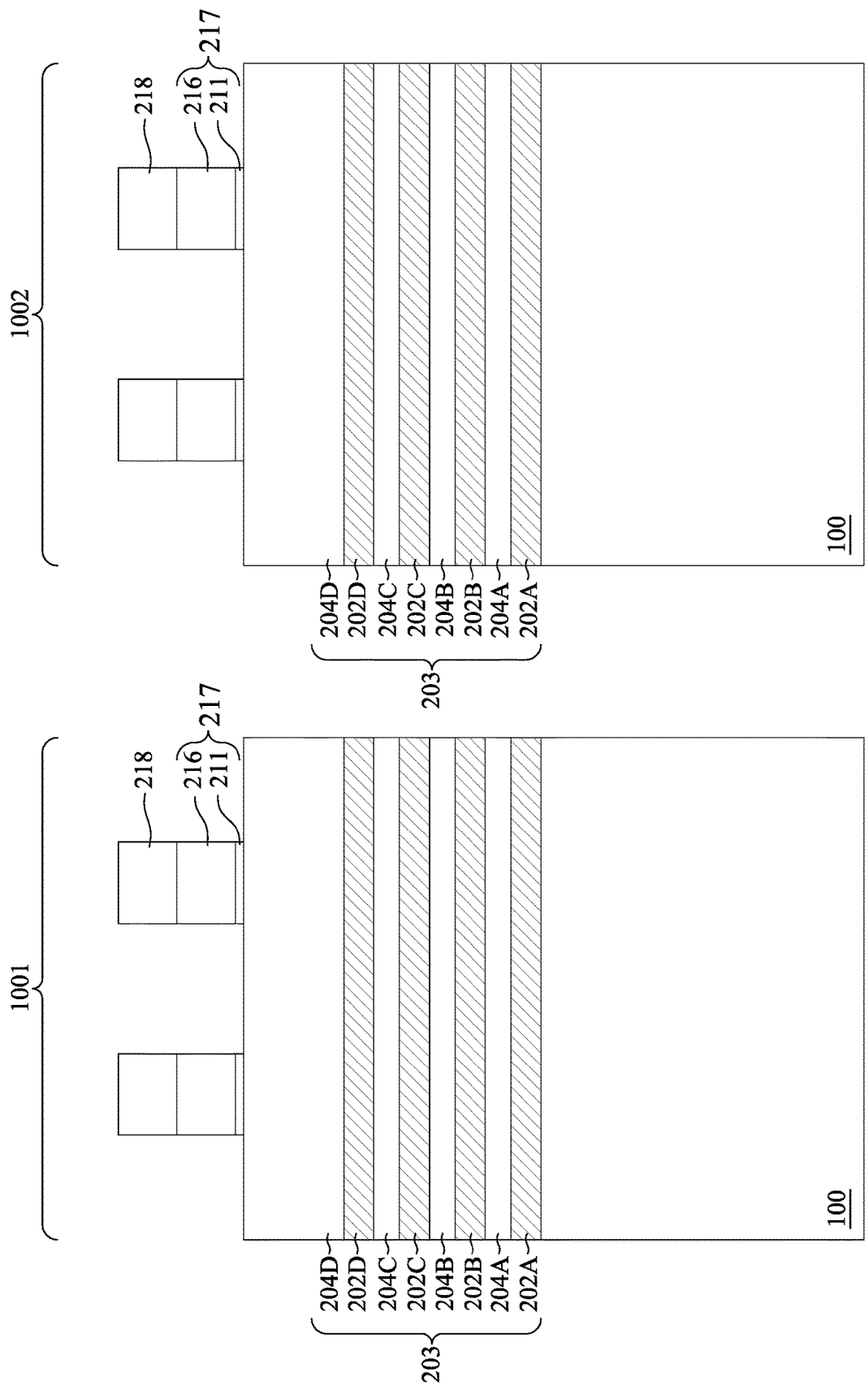
FIGS. 14B, 15B, 16B, 17B, 18B, 19B, 20B, 21B, 22B, 23B, 23C, 24B and 25B are cross-sectional views at intermediate fabrication stages, illustrating reference cross-section B-B' illustrated in FIG. 1 that extends through a fin along a longitudinal axis of the fin.

FIGS. 14A through 25B illustrate various following steps in the manufacturing of embodiment devices. FIGS. 15A, 16A, 17A, 18A, 19A, 20A, 20C, 21A and 21C illustrate features in either the first device regions 1001 or the second device regions 1002. In FIGS. 14A and 14B, the mask layer 214 (see FIG. 13) may be patterned using acceptable photolithography and etching techniques to form masks 218. The pattern of the masks 218 then may be transferred to the dummy gate layer 212 and to the dummy dielectric layer 210 to form dummy gates 216 and dummy gate dielectrics 211, respectively. The dummy gates 216 and the dummy gate dielectrics 211 are collectively referred to as dummy gate structures 217. The dummy gates 216 cover respective channel regions of the fin structures 206. The pattern of the masks 218 may be used to physically separate each of the dummy gates 216 from adjacent dummy gates 216. The dummy gates 216 may also have a lengthwise direction substantially perpendicular to the lengthwise direction of respective fin structures 206.

Figure 15A:
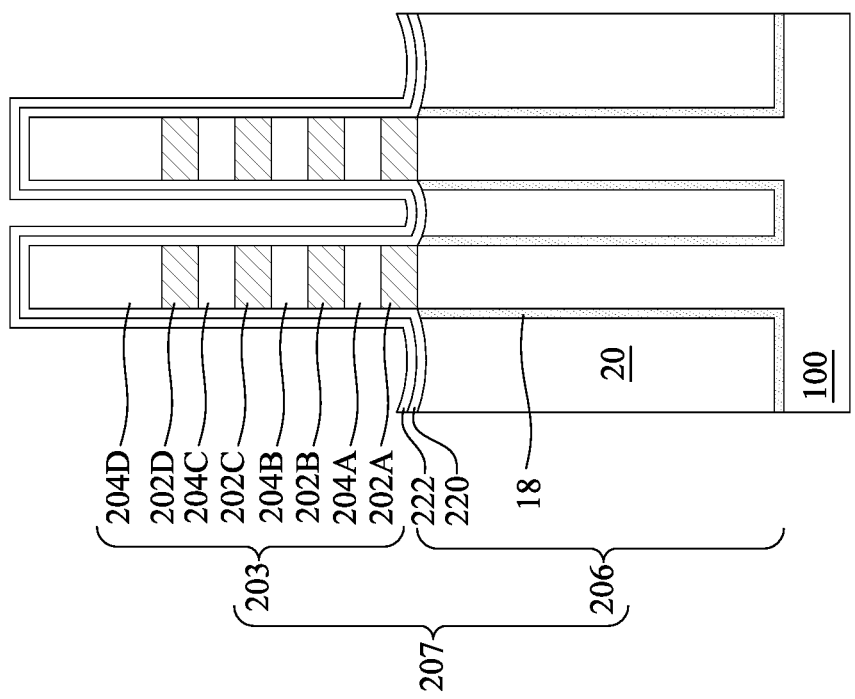
FIGS. 15A, 16A, 17A, 18A, 19A, 20A, 20C, 21C are cross-sectional views at intermediate fabrication stages, illustrating reference cross-section C-C' illustrated in FIG. 1 that extends through source/drain regions along the longitudinal direction of the gate region.
Figure 15B:
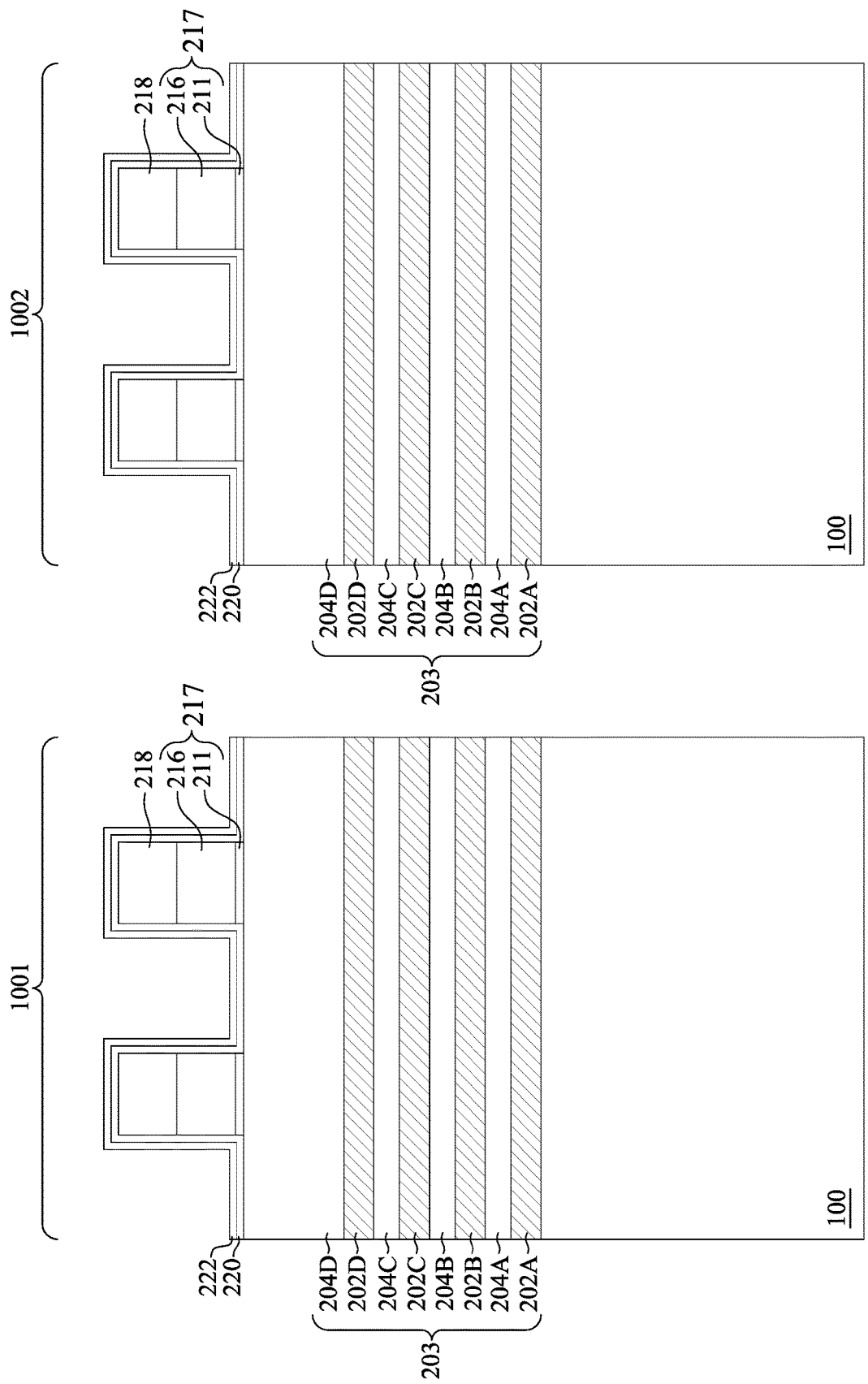

In FIGS. 15A and 15B, a first spacer layer 220 and a second spacer layer 222 are formed over the structures illustrated in FIGS. 14A and 14B, respectively. The first spacer layer 220 and the second spacer layer 222 will be subsequently patterned to act as spacers for forming self-aligned source/drain regions. In FIGS. 15A and 15B, the first spacer layer 220 is formed on top surfaces of the STI regions 20 and the liner layer 18; top surfaces and sidewalls of the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 16A:
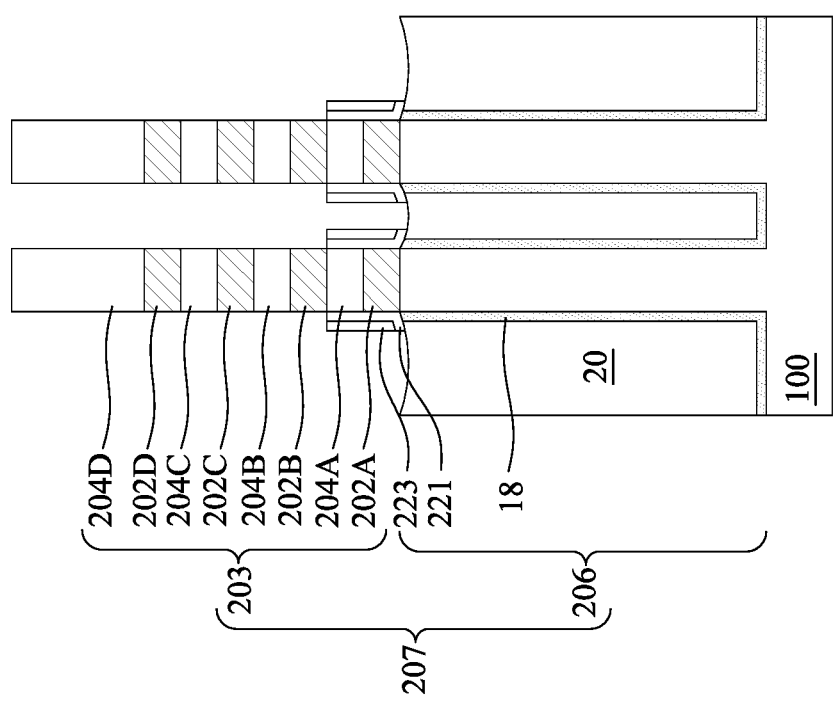
Figure 16B:
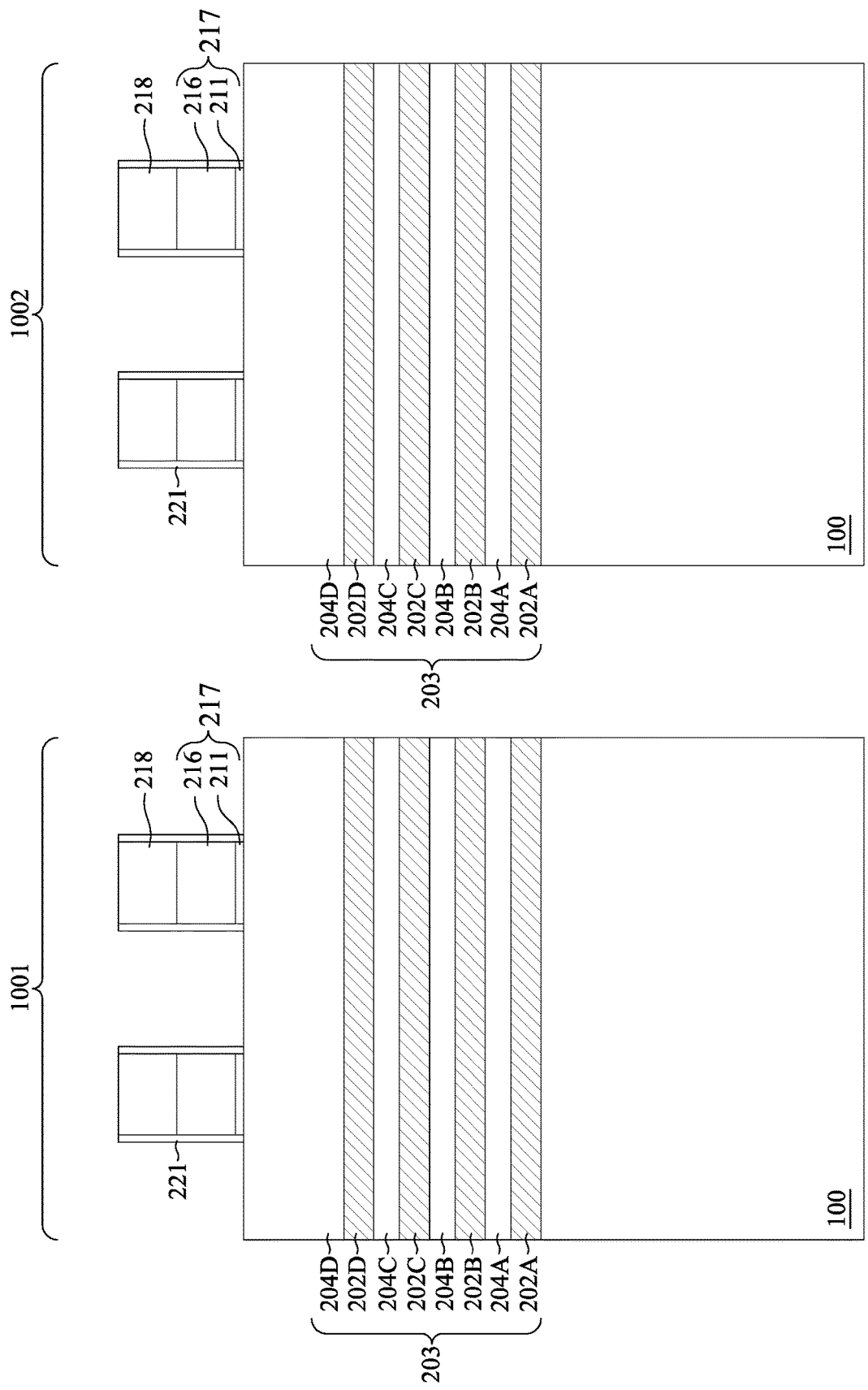

In FIGS. 16A and 16B, the first spacer layer 220 and the second spacer layer 222 are etched to form first spacers 221 and second spacers 223. As will be discussed in greater detail below, the first spacers 221 and the second spacers 223 act to self-align subsequently formed source drain regions, as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 16A. Thereafter, the second spacers 223 acts as a mask while etching exposed portions of the first spacer layer 220, thereby forming first spacers 221 as illustrated in FIG. 16A.

As illustrated in FIG. 16A, the first spacers 221 and the second spacers 223 are disposed on sidewalls of the nanostructures 203. As illustrated in FIG. 16B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy gate dielectrics 211. In other embodiments, a portion of the second spacer layer 222 may remain over the first spacer layer 220 adjacent the masks 218, the dummy gates 216, and the dummy gate dielectrics 211.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like. Furthermore, devices in first device region 1001 and devices in the second device region 1002 may be formed using different structures and steps.

Figure 17A:
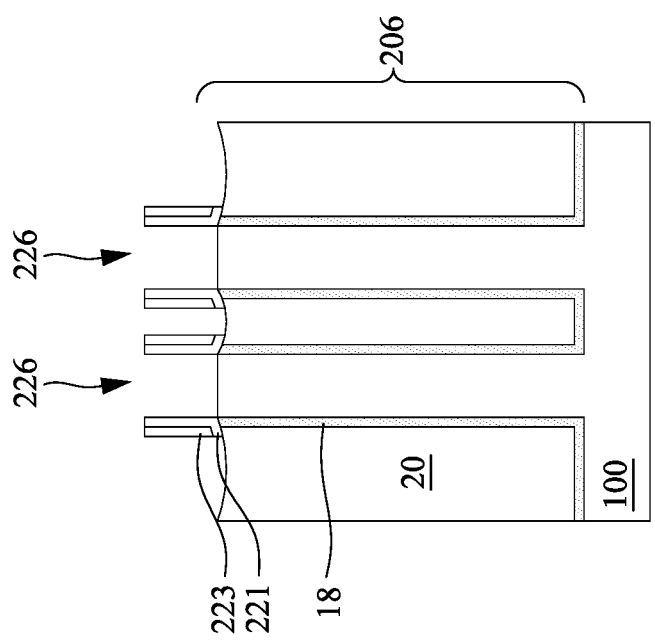
Figure 17B:
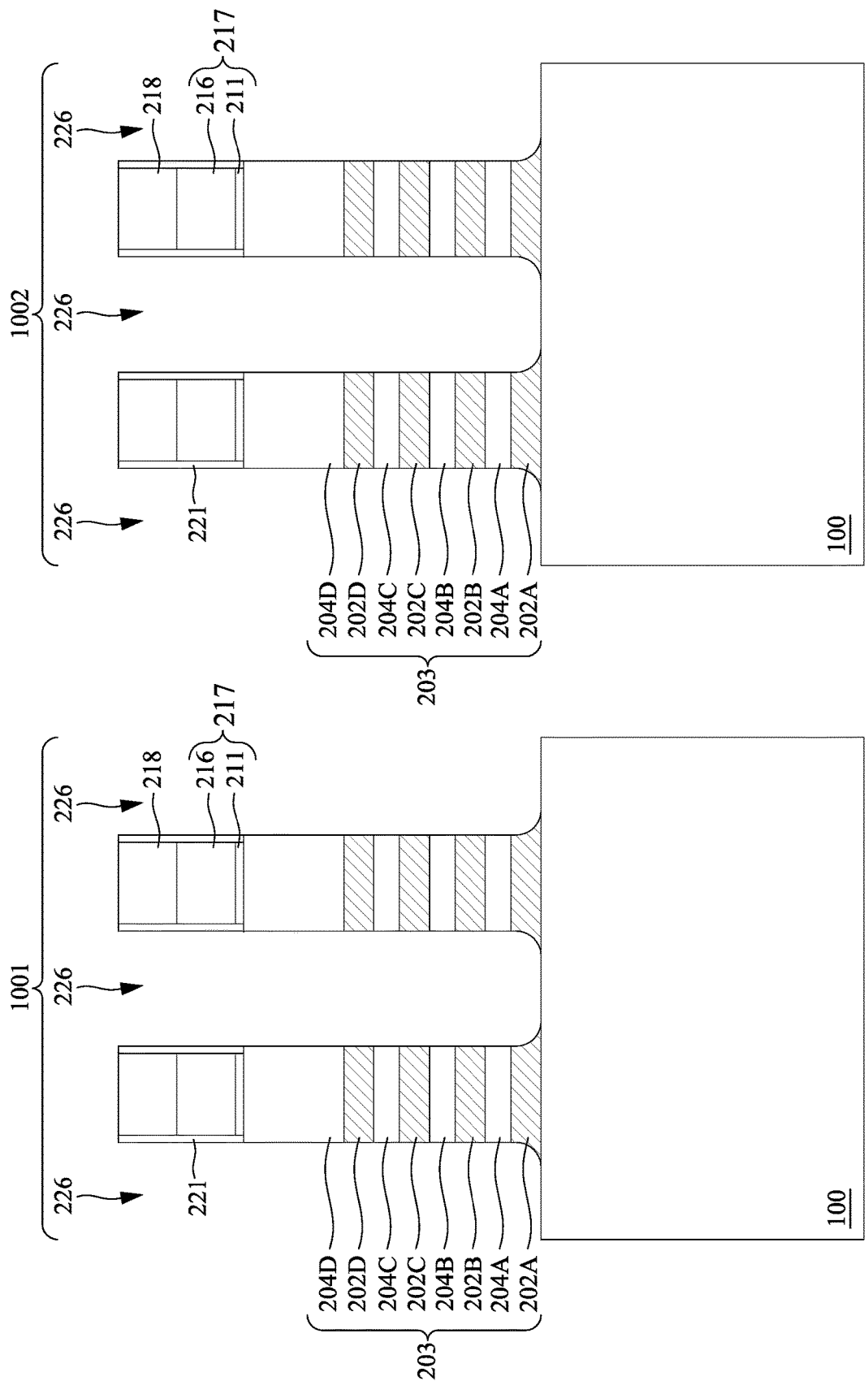

In FIGS. 17A and 17B, source/drain recesses 226 are formed in the nanostructures 203 and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in Fi. 17A, bottom surfaces of the source/drain recesses 226 may be substantially level with top surfaces of the STI regions 20, as an example. In some other embodiments, the fin structures 206 may be etched such that bottom surfaces of the source/drain recesses 226 are disposed below the top surfaces of the STI regions 20, or above the top surfaces of the STI regions 20. The source/drain recesses 226 may be formed by etching the nanostructures 203 and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 18A:
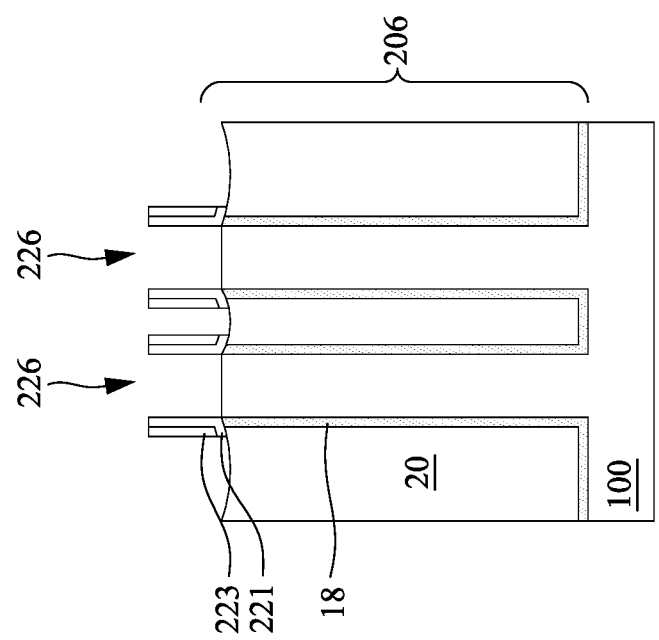
Figure 18B:
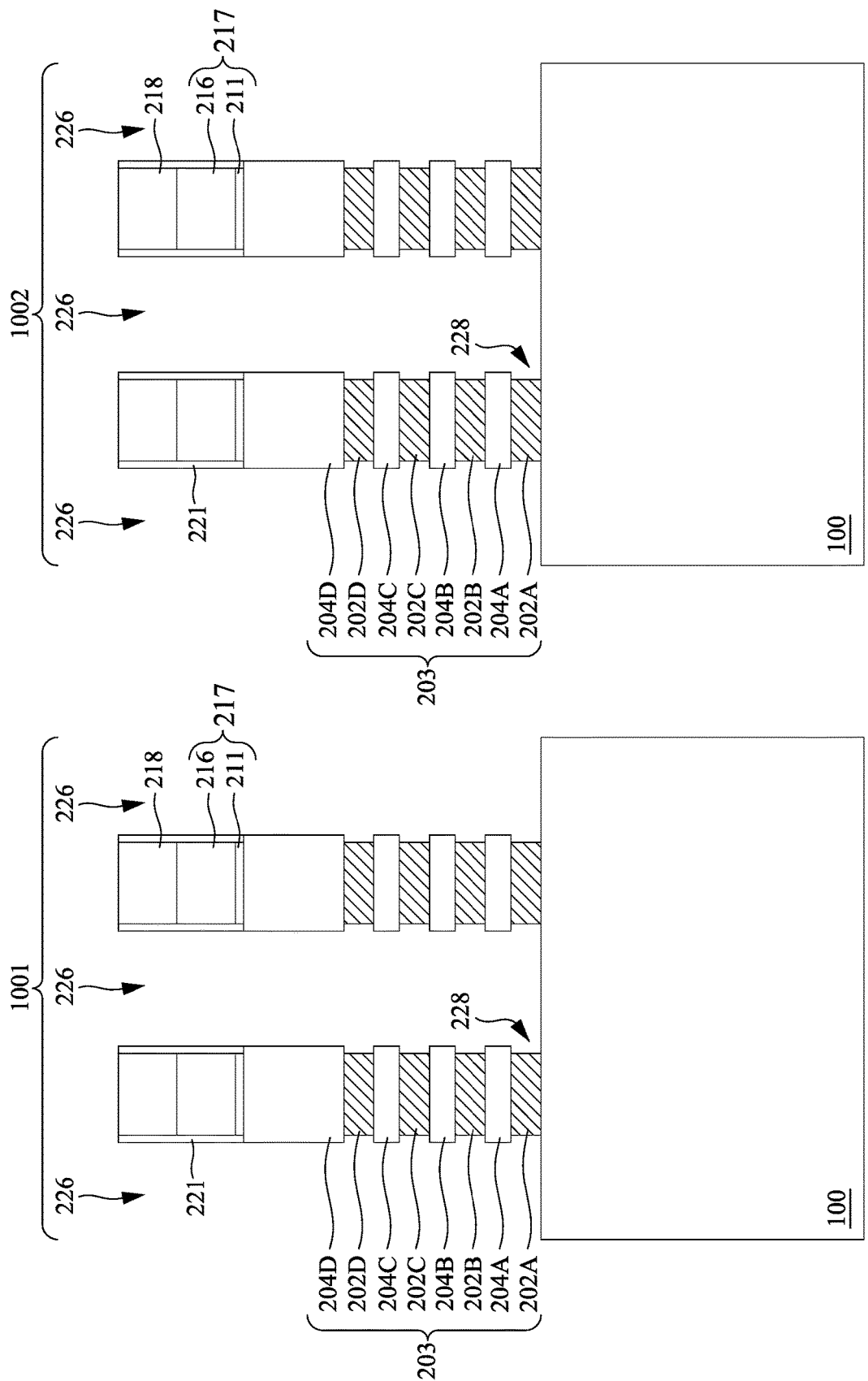

In FIGS. 18A and 18B, portions of sidewalls of the layers of the nanostructures 203 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in recesses 228 are illustrated as being straight in FIG. 18B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide (NH$_4$OH), or the like may be used to etch sidewalls of the first nanostructures 202.

Figure 19A:
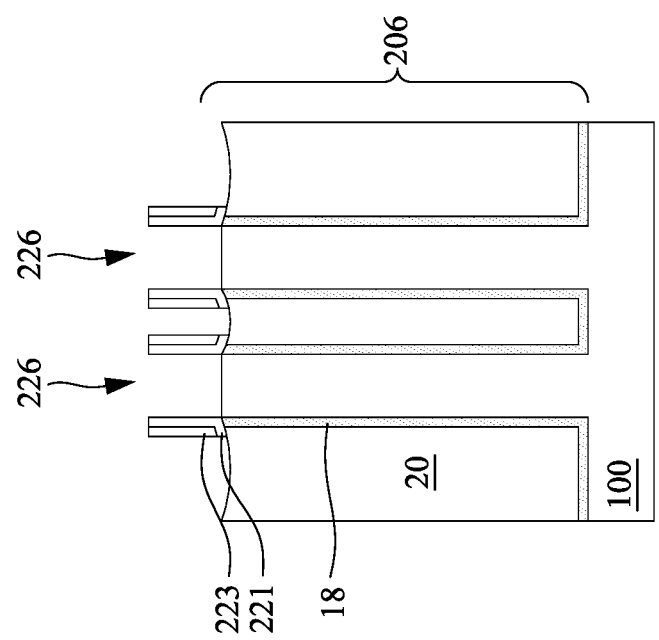
Figure 19B:
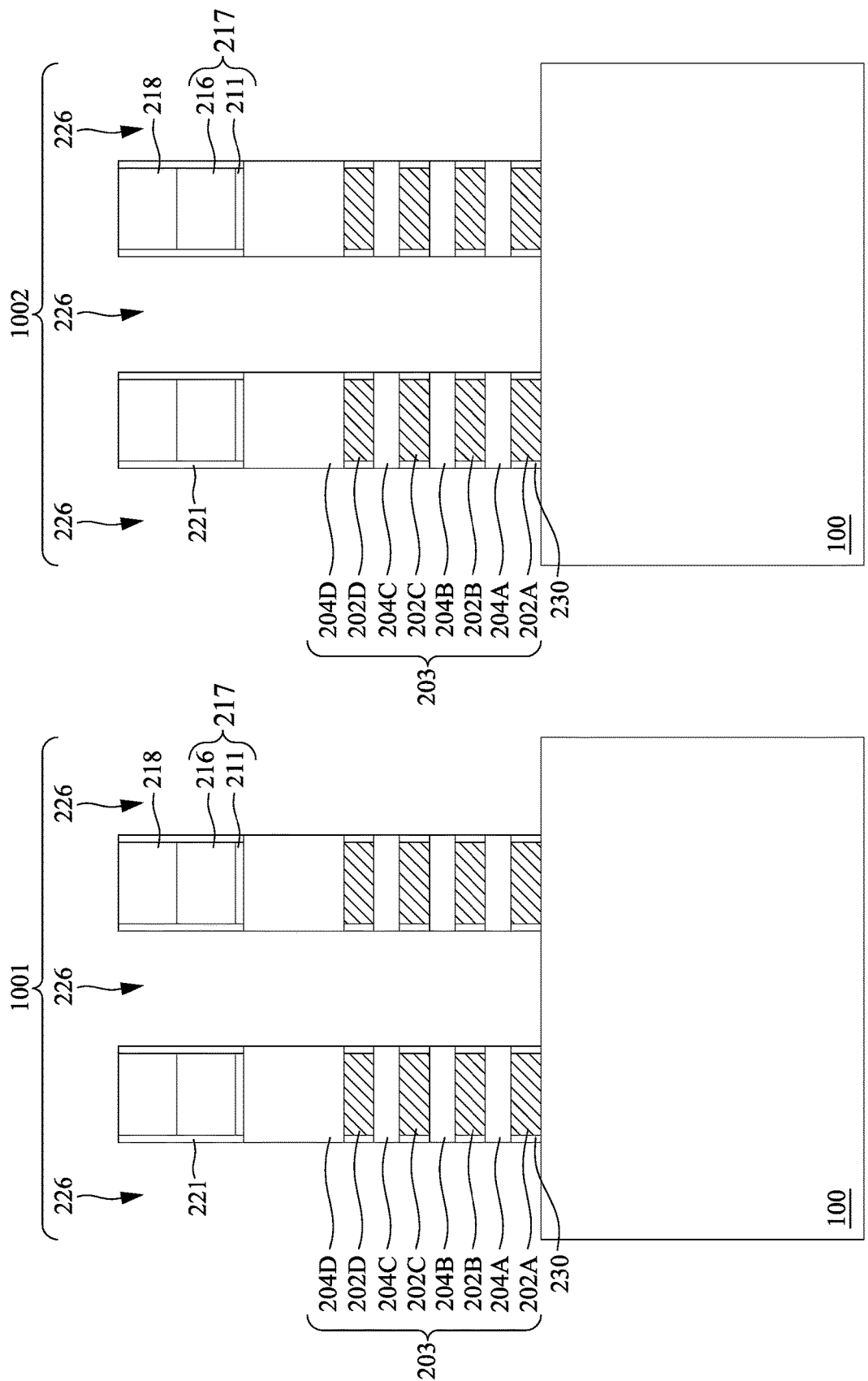

In FIGS. 19A and 19B, inner spacers 230 are formed in the sidewall recess 228. The inner spacers 230 may be formed by depositing an inner spacer layer (not separately illustrated) over the structures illustrated in FIGS. 18A and 18B. The inner spacers 230 act as isolation features between subsequently formed source/drain regions and gate structure. As will be discussed in greater detail below, source/drain regions will be formed in the recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 19B, the outer sidewalls of the inner spacers 230 may be concave or convex. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 20A and 20B) by subsequent etching processes, such as etching processes used to form gate structures.

Figure 20A:
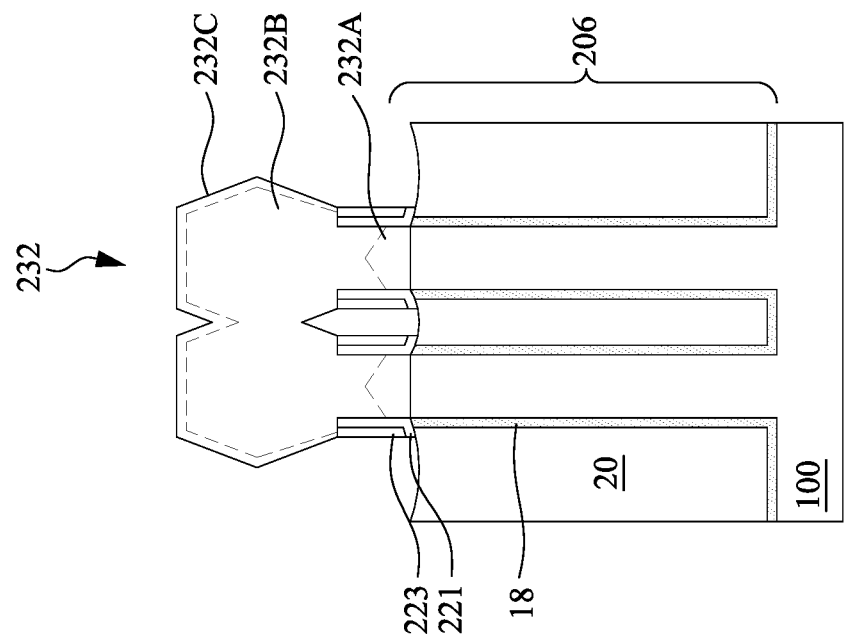
Figure 20B:
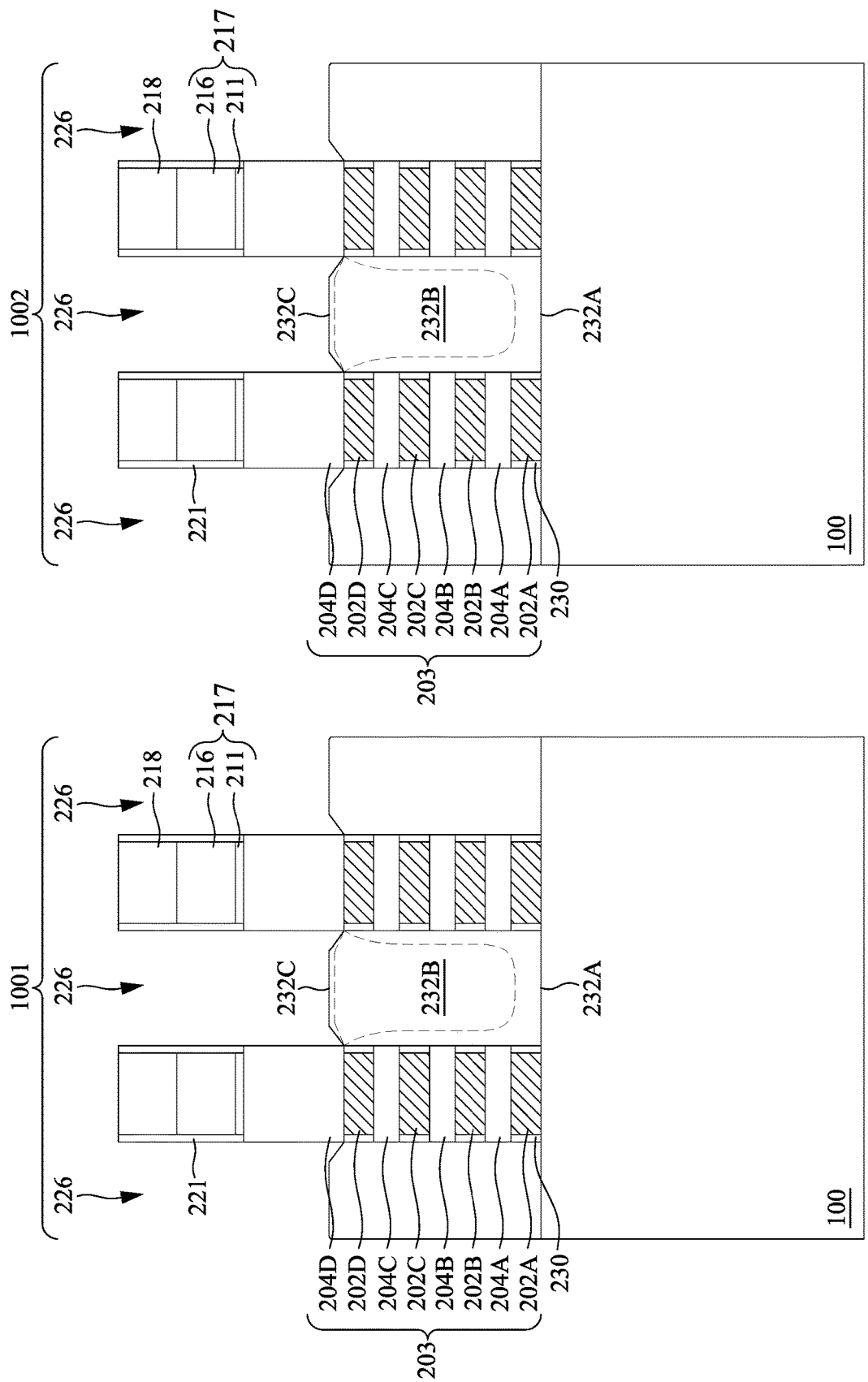

Epitaxial source/drain regions 232 are formed in the source/drain recesses 226, as shown in FIGS. 20A and 20B. In some embodiments, the source/drain regions 232 may exert stress on the second nanostructures 204, thereby improving device performance. As illustrated in FIG. 20B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gate layer 212 and the inner spacers 230 are used to separate the epitaxial source/drain regions 232 from the first nanostructures 202 by an appropriate lateral distance so that the epitaxial source/drain regions 232 do not short out with subsequently formed gates of the resulting GAA-FETs.

In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets.

The epitaxial source/drain regions 232 may be implanted with dopants to form source/drain regions, followed by an anneal. The n-type and/or p-type impurities for source/drain regions may be any of the impurities previously discussed. In some embodiments, the epitaxial source/drain regions 232 may be in situ doped during growth.

Figure 20C:
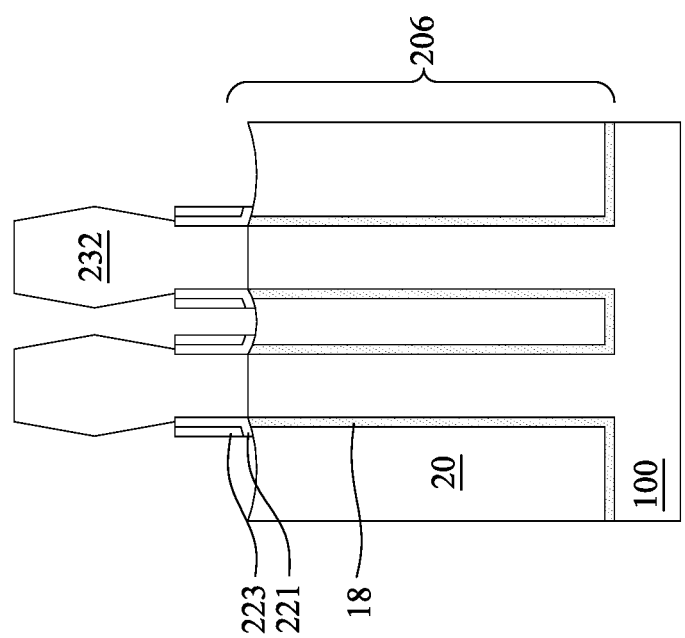

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 20A. In some other embodiments, adjacent epitaxial source/drain regions 232 remain separated after the epitaxy process is completed as illustrated by FIG. 20C. In the embodiments illustrated in FIGS. 20A and 20C, the first spacers 221 may be formed to a top surface of the STI regions 20 and the liner layer 18 thereby blocking the lateral epitaxial growth. In some other embodiments, the first spacers 221 may cover portions of the sidewalls of the nanostructures 203 further blocking the epitaxial growth. In some other embodiments, the spacer etch used to form the first spacers 221 may be adjusted to remove the spacer material to allow the epitaxially grown region to extend to the surface of the STI region 20.

The epitaxial source/drain regions 232 may comprise one or more semiconductor material layers. For example, the epitaxial source/drain regions 232 may comprise a first semiconductor material layer 232A, a second semiconductor material layer 232B, and a third semiconductor material layer 232C. Any number of semiconductor material layers may be used for the epitaxial source/drain regions 232. Each of the first semiconductor material layer 232A, the second semiconductor material layer 232B, and the third semiconductor material layer 232C may be formed of different semiconductor materials and may be doped to different dopant concentrations. In some embodiments, the first semiconductor material layer 232A may have a dopant concentration less than the second semiconductor material layer 232B and greater than the third semiconductor material layer 232C. In embodiments in which the epitaxial source/drain regions 232 comprise three semiconductor material layers, the first semiconductor material layer 232A may be deposited, the second semiconductor material layer 232B may be deposited over the first semiconductor material layer 232A, and the third semiconductor material layer 232C may be deposited over the second semiconductor material layer 232B.

Figure 21A:
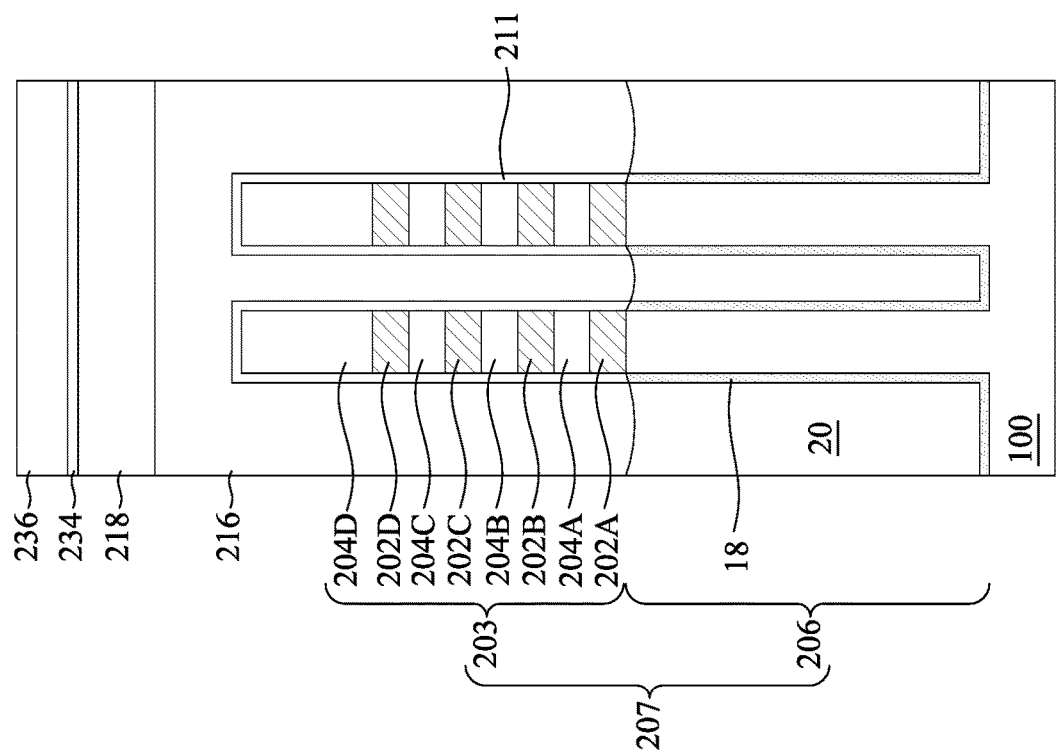
Figure 21B:
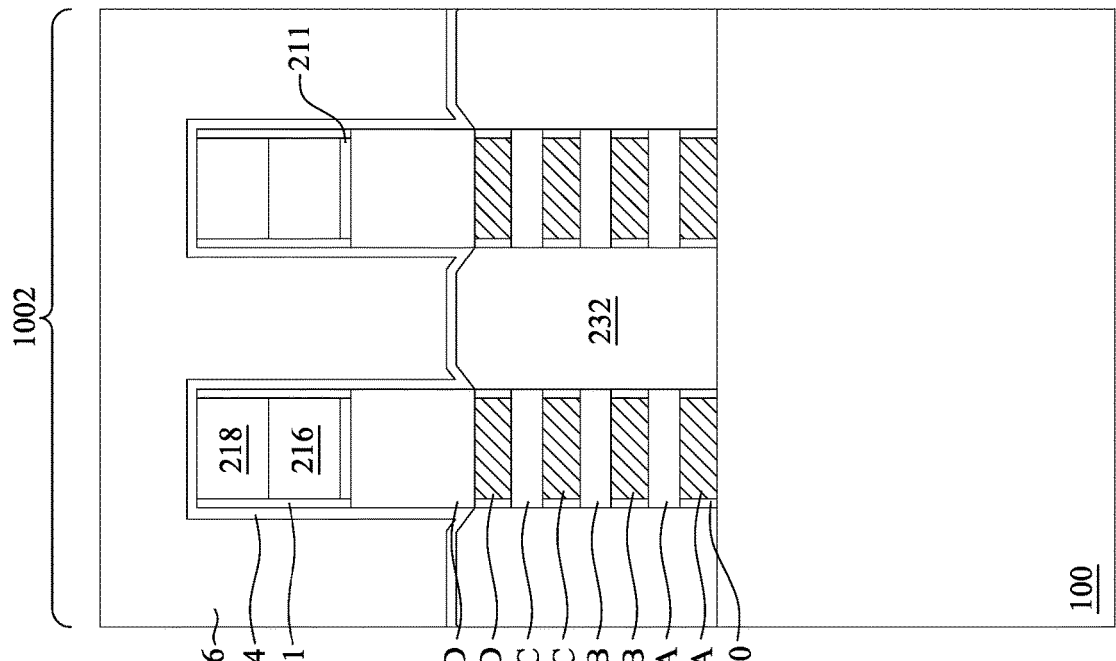
Figure 21B:
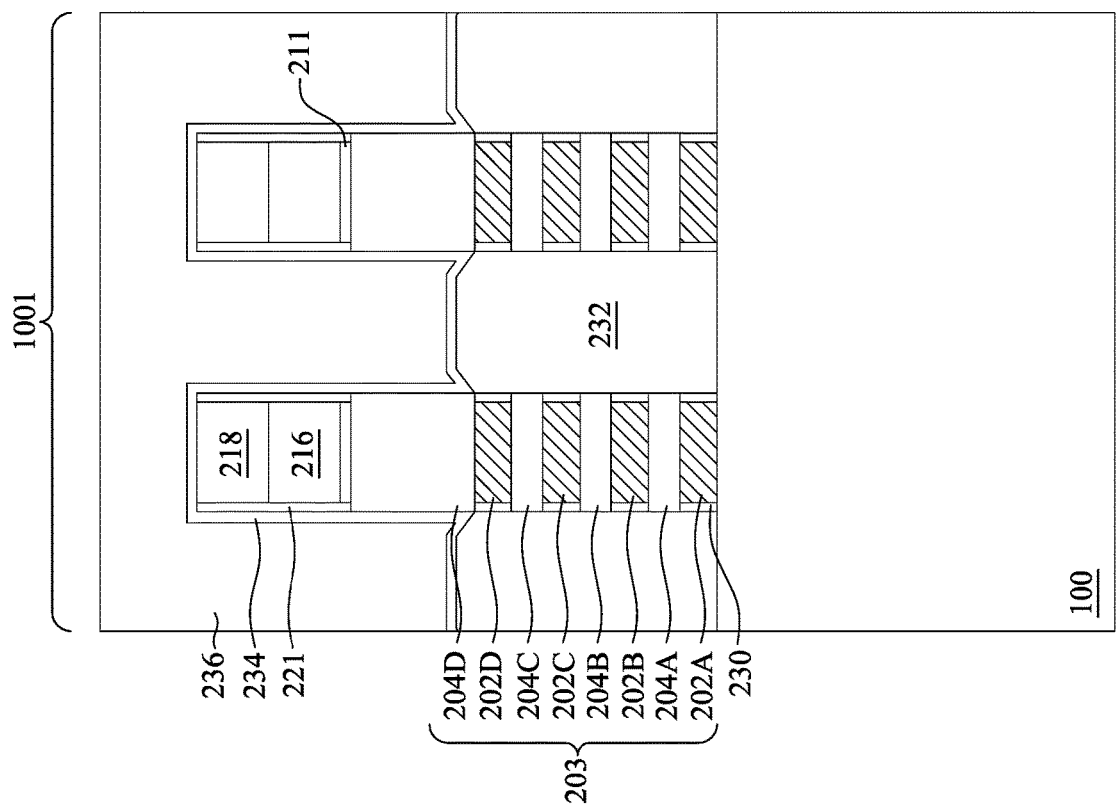
Figure 21C:
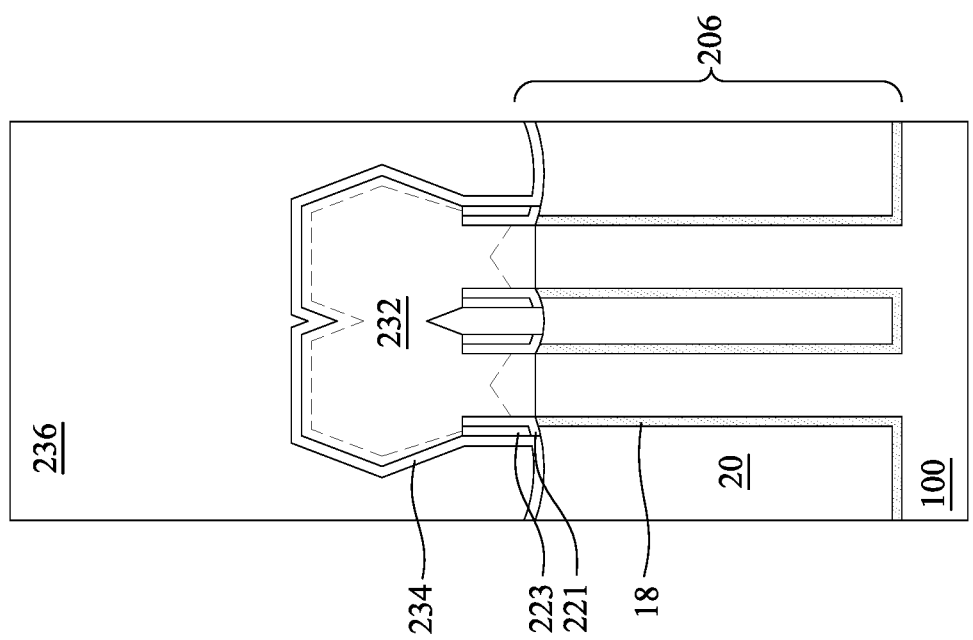

In FIGS. 21A-21C, an interlayer dielectric (ILD) layer 236 is deposited over the structure illustrated in FIGS. 20A-20C. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 214, and the first spacers 221. The CESL 234 may comprise a dielectric material, such as, silicon nitride, silicon oxide, silicon oxynitride, or the like, having a different etch rate than the material of the overlying ILD layer 236.

Figure 22A:
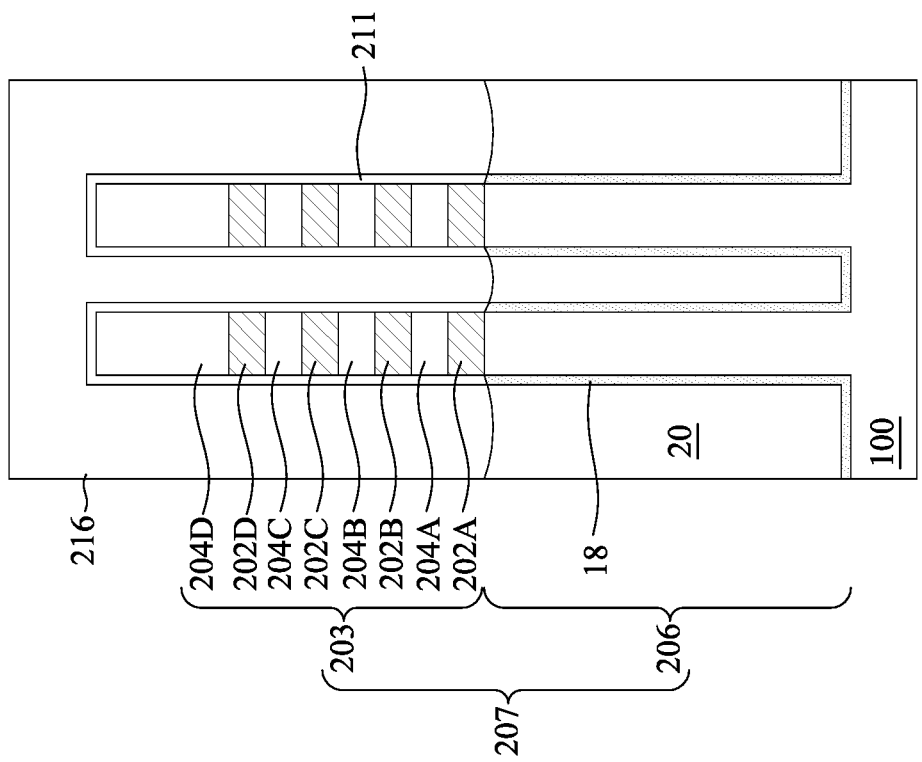
Figure 22B:
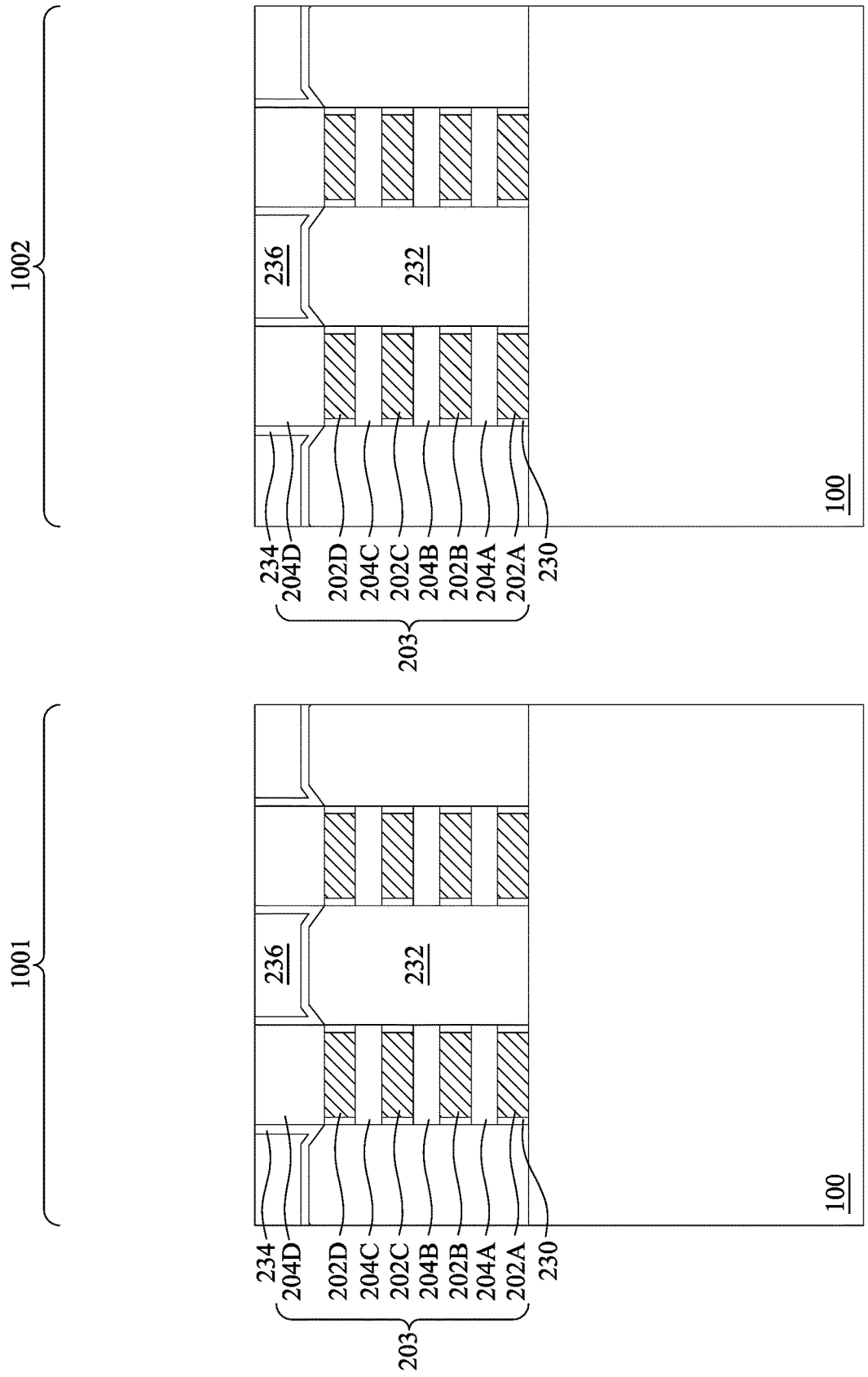

A planarization process, such as a CMP, may be performed to remove the masks 218 on the dummy gates 216, the first spacers 221 along sidewalls of the masks 218 and the dummy gate dielectrics 211. The planarization process levels the top surface of the ILD layer 236 with the top surfaces of the topmost second semiconductor layer 204D. The planarization process may further go on to remove top portions of the topmost second semiconductor layer 204D, the CESL 234 and the ILD layer 236, as shown in FIGS. 22A and 22B, to reach a desired thickness of a subsequently formed gate electrode (see FIG. 25B). After the planarization process, top surfaces of the topmost second semiconductor layer 204D, and the ILD layer 236 are level within process variations. Accordingly, the top surfaces of the topmost second semiconductor layer 204D are exposed through the ILD layer 236.

Figure 23A:
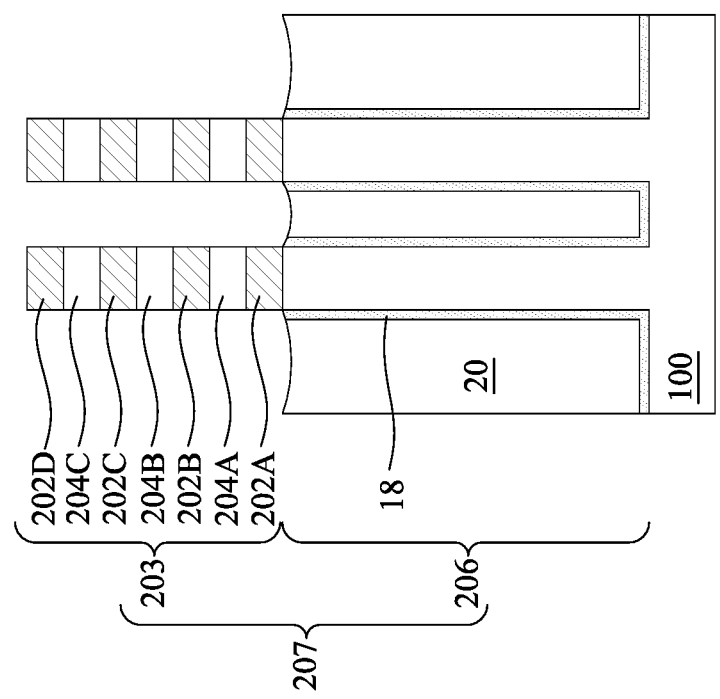
Figure 23B:
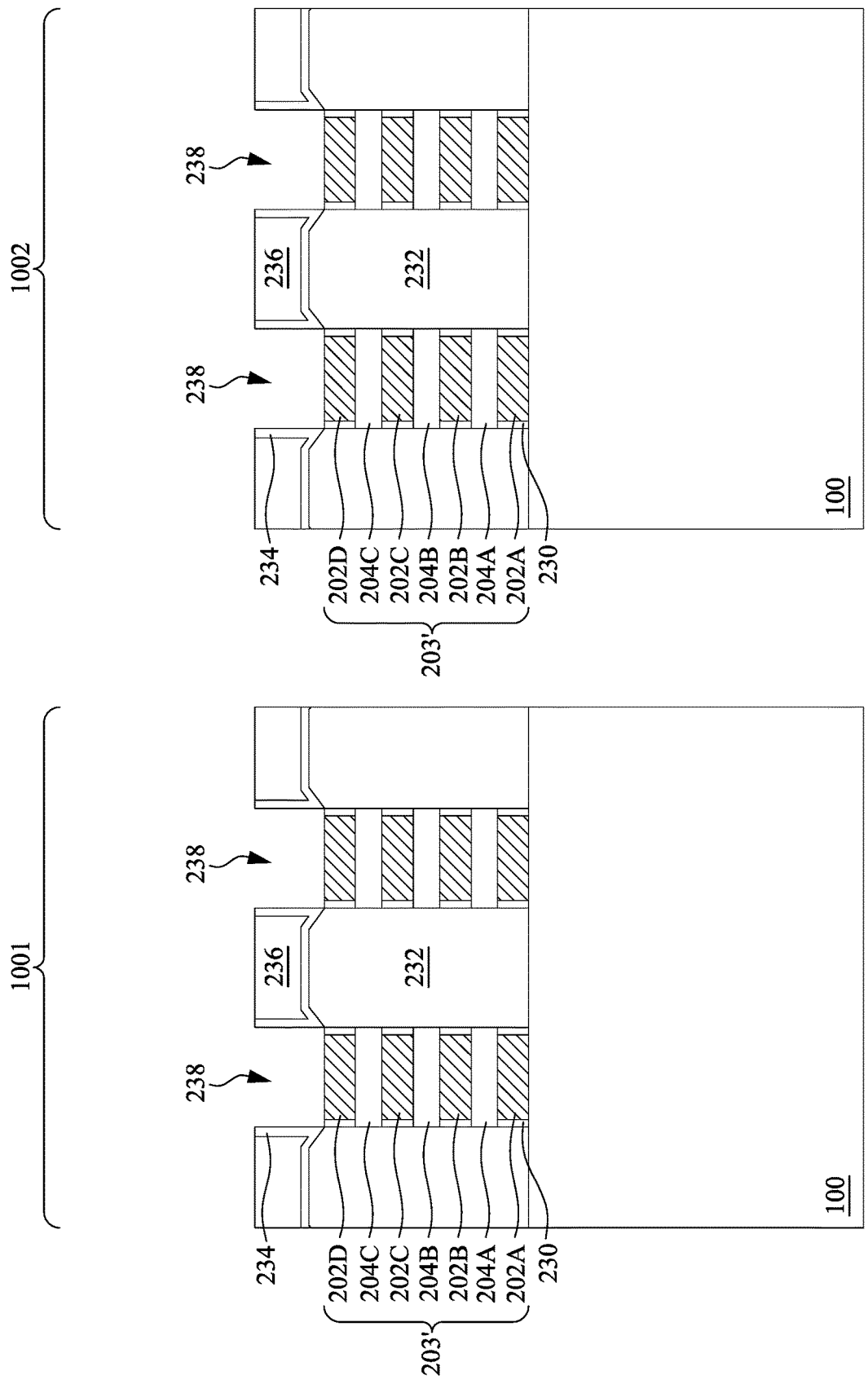

In FIGS. 23A and 23B, the topmost second semiconductor layer 204D are removed in one or more etching steps, so that gate trenches 238 are formed between corresponding CESL 234. In some embodiments, the topmost second semiconductor layers 204D are removed by an anisotropic dry etch process. For example, the etching process may include a dry etch process using reaction gas(es) that selectively etch the topmost second semiconductor layer 204D at a faster rate than the ILD layer 236. Each gate trench 238 exposes and/or overlies portions of nanostructures 203', which act as channel regions in subsequently completed GAA-FETs. The nanostructures 203' which act as the channel regions are disposed between neighboring pairs of the epitaxial source/drain regions 232. During the removal, the topmost first semiconductor layer 202D may be used as etch stop layers when the topmost second semiconductor layer 204D are etched.

Figure 23C:
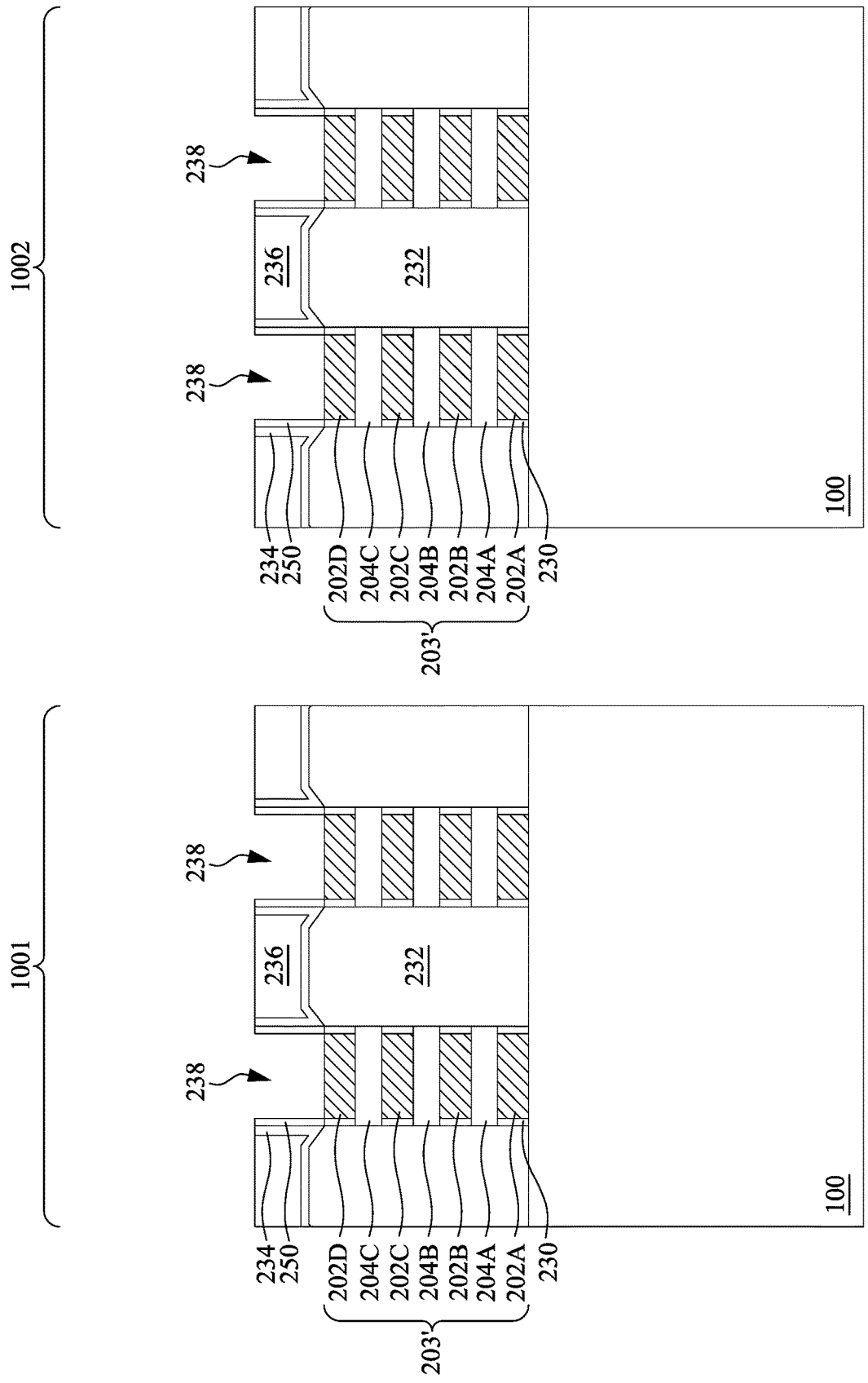

In FIG. 23C, sidewall spacers 250 may be disposed on sidewalls of the CESL 234. In some embodiments, a spacer layer is formed over the structure illustrated in FIGS. 22A and 22B and subsequently etched to form the sidewall spacers 250. The spacer layer may be formed of silicon oxide, silicon nitride, silicon oxynitride, or the like, using techniques such as thermal oxidation or deposited by CVD, ALD, or the like. The spacer layer may then be etched using an anisotropic etch process in which remaining portions of the spacer layer form sidewall spacers 250.

Figure 24A:
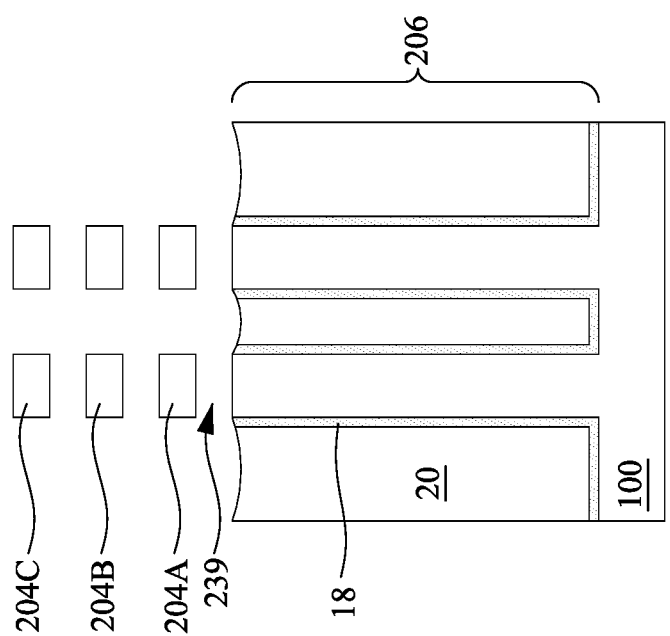
Figure 24B:
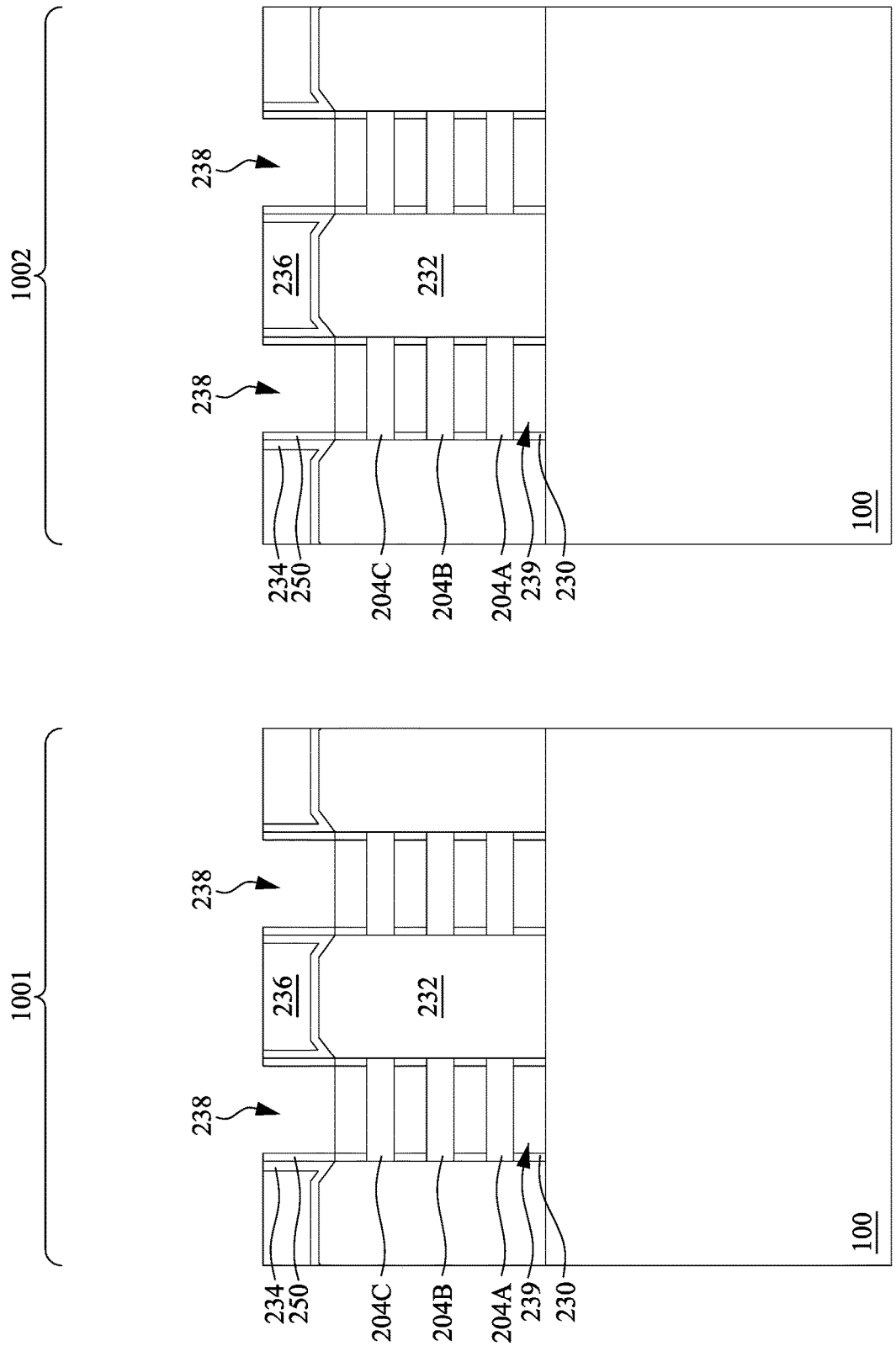

In FIGS. 24A and 24B, the first nanostructures 202 in the gate trenches 238 are removed by an isotropic etching process such as wet etching or the like using etchants which are selective to the materials of the first nanostructures 202. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-sheet spaces if the nanostructures 204 are nanosheets). This step can be referred to as a channel release process. As illustrated in FIGS. 24A and 24B, gaps 239 (empty spaces) are formed between the second nanostructures 204. At this interim processing step, the gaps 239 between second nanostructures 204 may be filled with ambient environment conditions (e.g., air, nitrogen, etc). In some embodiments, the second nanostructures 204 can be referred to as nanosheets, nanowires, nanoslabs, nanorings having nano-scale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide ($NH_4OH$) or the like may be used to remove the first nanostructures 202. In some embodiments, both the channel release step and the previous step of laterally recessing first nanostructures 202 (i.e., the step as illustrated in FIGS. 18A-18B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

Figure 25A:
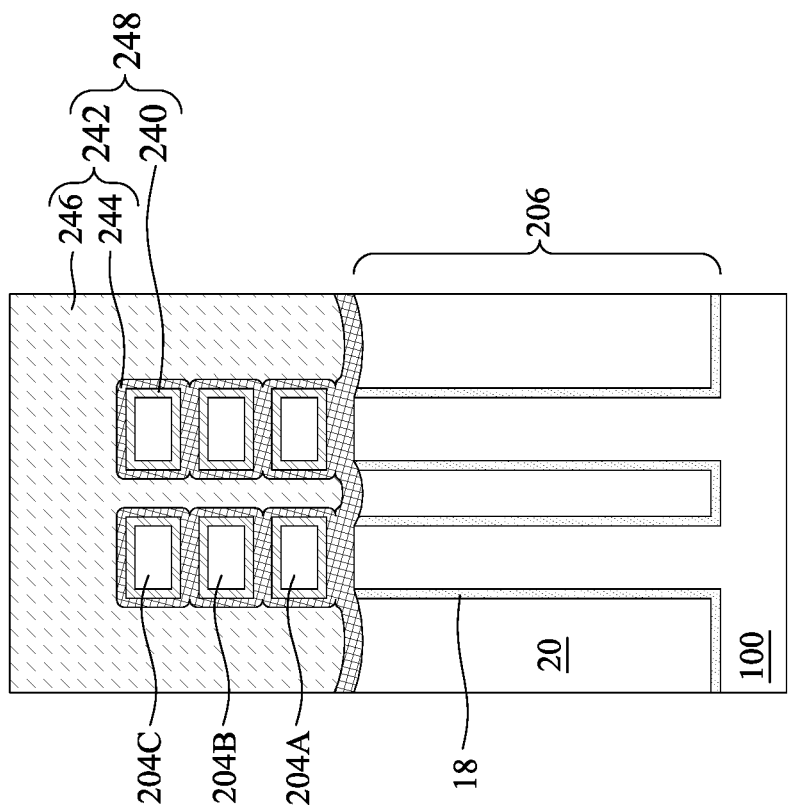
Figure 25B:
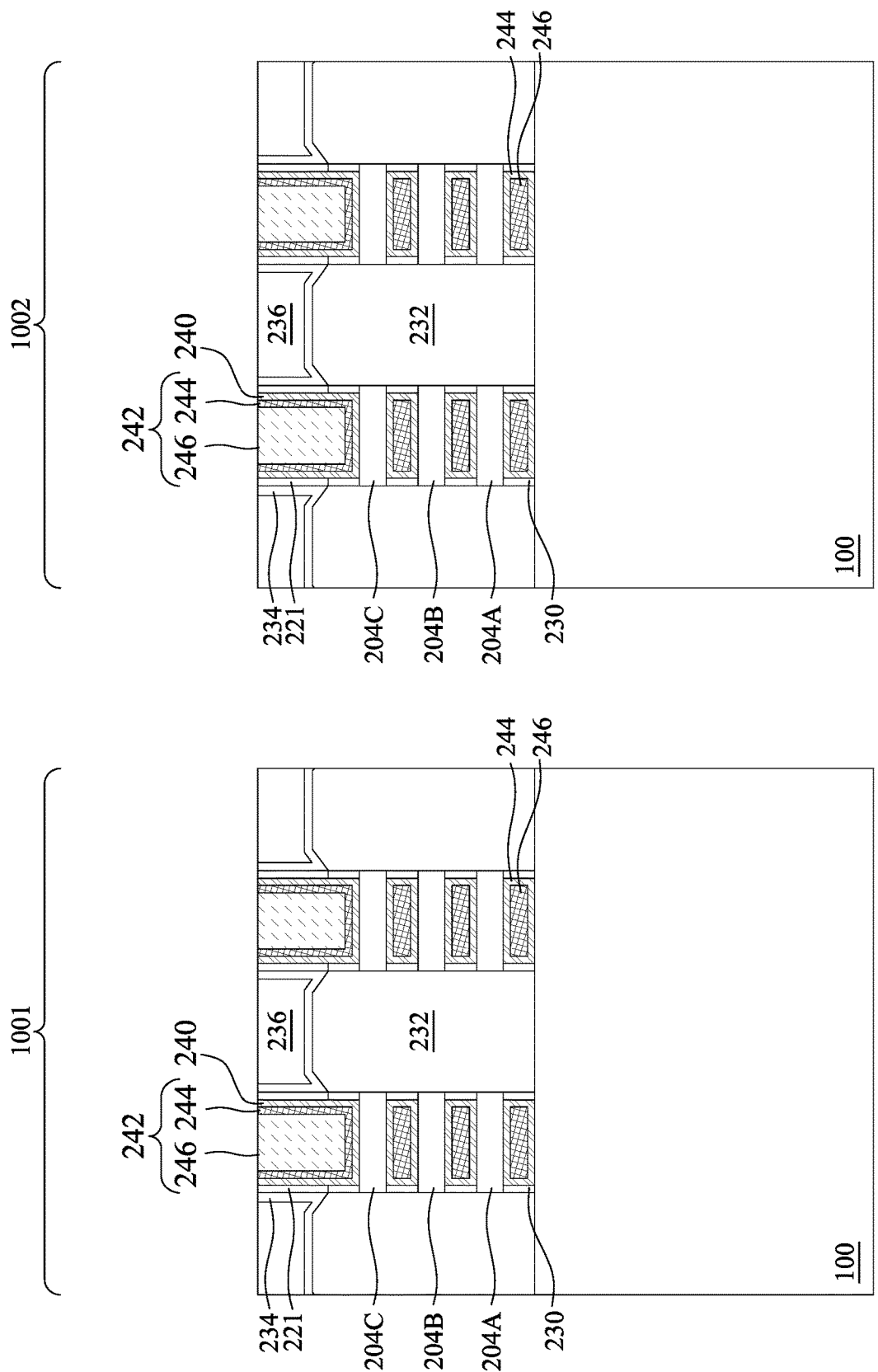

Next, in FIGS. 25A and 25B, high-k/metal gate structures are formed. For example, a gate dielectric layer 240 is formed (e.g., conformally) in the gate trenches 238 and in the gaps 239. The gate dielectric layer 240 wraps around the second nanostructures 204, lines sidewalls of the inner spacers 230 and sidewalls of the first spacers 211, and extends along the upper surface of the fin structures 206. In accordance with some embodiments, the gate dielectric layer 120 comprises silicon oxide, silicon nitride, or multi-layers thereof. In some embodiments, the gate dielectric layer 240 includes a high-k dielectric material, and in these embodiments, the gate dielectric layer 240 may have a dielectric constant greater than about 7.0, and may include a metal oxide or a silicate of Hf, Al, Zr, La, Mg, Ba, Ti, or Pb, or combinations thereof. The formation methods of the gate dielectric layer 240 may include Molecular-Beam Deposition (MBD), ALD, PECVD, and the like.

In an alternative embodiment, an interfacial layer (not shown) is deposited between the gate dielectric layer 240 and the second nanostructures 204 and is formed of silicon oxide or silicon oxynitride grown by a thermal oxidation process. For example, the interfacial layer can be grown by a rapid thermal oxidation (RTO) process or by an annealing process using oxygen.

Next, a gate electrode material (e.g., an electrically conductive material) is formed in the gate trenches 238 and in the gaps 239 to form the gate electrodes 242. The gate electrodes 242 fill the remaining portions of the gate trenches 238 and in the gaps 239. For example, the gate electrodes 242 include one or more work function layers 244 and a fill metal layer 246. A CMP is then performed on the fill metal layer 246, the one or more work function layers 244 and the gate dielectric layer 240 until the ILD layer 236 is exposed, resulting in the fill metal layer 246, the one or more work function layers 244 and the gate dielectric layer 240, the CESL 234, and the ILD layer 236 having substantially level top surfaces. The gate electrodes 242 and the gate dielectric layer 240 are collectively referred to as metal gate structures 248.

The one or more work function layers 244 may be deposited to surround each of the second nanostructures 204. A portion of the one or more work function layers 244 is formed vertically between adjacent second nanostructures 204 and fills the gaps 239 between adjacent nanostructures 204.

The one or more work function layers can provide a suitable work function for the high-k/metal gate structures. For an n-type GAA FET, the one or more work function layers 244 may include one or more n-type work function metals (N-metal). The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the one or more work function layers 244 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal layer 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by using the ion implantation process, the insulating layer for forming the shallow trench isolation region can have reduced etch rate. Another advantage is that the reduced etch rate can aid in reducing an etch rate difference between the liner layer and the insulating layer. Another advantage is the reduced etch rate difference may be advantageous for mitigating the dishing effect of the STI region.

In some embodiments, a method of forming a semiconductor device includes etching trenches in a substrate to form fin structures, depositing a liner layer to line the trenches, filling the trenches with an insulating layer, performing an ion implantation process to the insulating layer, after performing the ion implantation process, recessing the insulating layer to form shallow trench isolation (STI) regions adjacent the fin structures, and forming a gate crossing the fin structures. In some embodiments, the method further comprises etching the insulating layer prior to the ion implantation process. In some embodiments, the method further comprises forming a multi-layer stack on the substrate, the multi-layer stack comprising alternately stacking first semiconductor layers and second semiconductor layers, and patterning the multi-layer stack to form first nanostructures and second nanostructures, wherein after etching the insulating layer, the insulating layer remains covering a topmost layer of the first nanostructures. In some embodiments, after recessing the insulating layer, the STI regions have a top surface recessed into the STI regions with a maximum depth of less than 5 nm. In some embodiments, performing the ion implantation process comprises: introducing impurities comprising Si atoms, He atoms, N atoms or a combination thereof into the insulating layer. In some embodiments, an implant depth of the ion implantation process is in a range from 30 nm to 50 nm. In some embodiments, the ion implantation process is performed to introduce impurities into an upper portion of the insulating layer without introducing the impurities into a lower portion of the insulating layer. In some embodiments, recessing the insulating layer is performed to remove the upper portion without removing the lower portion.

In some embodiments, a method of forming a semiconductor device includes forming a multi-layer stack on a substrate, wherein the multi-layer stack comprises alternately stacked first semiconductor layers and second semiconductor layers, etching trenches in the multi-layer stack and the substrate to form fins each comprising alternately stacked first nanostructures and second nanostructures, filling the trenches with an insulating layer, performing a first recessing process to the insulating layer such that a topmost one of the second nanostructures is exposed, implanting the insulating layer using ions, performing a second recessing process to the insulating layer to form shallow trench isolation (STI) regions below the first and second nanostructures, and forming a gate structure in place of the first nanostructures. In some embodiments, the topmost one of the second nanostructures has a thickness greater than a thickness of a topmost one of the first nanostructures. In some embodiments, the topmost one of the second nanostructures has a thickness greater than a thickness of another one of the second nanostructures. In some embodiments, the method further comprises prior to etching the trenches in the multi-layer stack and the substrate, forming a pad layer and a mask layer in sequence over the multi-layer stack, and during the first recessing process, the pad layer and the mask layer remain over the multi-layer stack. In some embodiments, during implanting the insulating layer, the pad layer and the mask layer remain over the multi-layer stack. In some embodiments, during the second recessing process, the pad layer and the mask layer remain over the multi-layer stack. In some embodiments, the pad layer and the mask layer are removed after the second recessing process. In some embodiments, the first recessing process is stopped when a bottom of the topmost one of the second nanostructures is exposed. In some embodiments, the first recessing process is performed such that the insulating layer has a top surface recessed into the insulating layer having a maximum depth in a range from 0.5 nm to 1.5 nm. In some embodiments, the topmost one of the second nanostructures is removed before forming the gate structure.

In some embodiments, a semiconductor device includes a fin structure protruding from a substrate, a shallow trench isolation (STI) region adjacent the fin structure, a gate structure crossing the fin structure and source/drain regions on opposite sides of the gate structure. The STI region has impurities having an impurity concentration gradient. In some embodiments, the impurities comprise Si, N, He or a combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    etching trenches in a substrate to form fin structures;
    depositing a liner layer to line the trenches;
    filling the trenches with an insulating layer;
    performing an ion implantation process to the insulating layer;
    after performing the ion implantation process, recessing the insulating layer to form shallow trench isolation (STI) regions adjacent the fin structures; and
    forming a gate crossing the fin structures.

2. The method of claim 1, further comprising:
    etching the insulating layer prior to the ion implantation process.

3. The method of claim 2, further comprising:
    forming a multi-layer stack on the substrate, the multi-layer stack comprising alternately stacking first semiconductor layers and second semiconductor layers; and
    patterning the multi-layer stack to form first nanostructures and second nanostructures,
    wherein after etching the insulating layer, the insulating layer remains covering a topmost layer of the first nanostructures.

4. The method of claim 1, wherein after recessing the insulating layer, the STI regions have a top surface recessed into the STI regions with a maximum depth of less than 5 nm.

5. The method of claim 1, wherein performing the ion implantation process comprises:
    introducing impurities comprising Si atoms, He atoms, N atoms or a combination thereof into the insulating layer.

6. The method of claim 1, wherein an implant depth of the ion implantation process is in a range from 30 nm to 50 nm.

7. The method of claim 1, wherein the ion implantation process is performed to introduce impurities into an upper portion of the insulating layer without introducing the impurities into a lower portion of the insulating layer.

8. The method of claim 7, wherein recessing the insulating layer is performed to remove the upper portion without removing the lower portion.

9. A method of forming a semiconductor device, comprising:
    forming a multi-layer stack on a substrate, wherein the multi-layer stack comprises alternately stacked first semiconductor layers and second semiconductor layers;
    etching trenches in the multi-layer stack and the substrate to form fins each comprising alternately stacked first nanostructures and second nanostructures;
    filling the trenches with an insulating layer;
    performing a first recessing process to the insulating layer such that a topmost one of the second nanostructures is exposed;
    implanting the insulating layer using ions;
    performing a second recessing process to the insulating layer to form shallow trench isolation (STI) regions below the first and second nanostructures; and
    forming a gate structure in place of the first nanostructures.

10. The method of claim 9, wherein the topmost one of the second nanostructures has a thickness greater than a thickness of a topmost one of the first nanostructures.

11. The method of claim 9, wherein the topmost one of the second nanostructures has a thickness greater than a thickness of another one of the second nanostructures.

12. The method of claim 9, further comprising:
    prior to etching the trenches in the multi-layer stack and the substrate, forming a pad layer and a mask layer in sequence over the multi-layer stack; and
    during the first recessing process, the pad layer and the mask layer remain over the multi-layer stack.

13. The method of claim 12, wherein during implanting the insulating layer, the pad layer and the mask layer remain over the multi-layer stack.

14. The method of claim 12, wherein during the second recessing process, the pad layer and the mask layer remain over the multi-layer stack.

15. The method of claim 12, wherein the pad layer and the mask layer are removed after the second recessing process.

16. The method of claim 9, wherein the first recessing process is stopped when a bottom of the topmost one of the second nanostructures is exposed.

17. The method of claim 9, wherein the first recessing process is performed such that the insulating layer has a top surface recessed into the insulating layer having a maximum depth in a range from 0.5 nm to 1.5 nm.

18. The method of claim 9, wherein the topmost one of the second nanostructures is removed before forming the gate structure.

19. A method of forming a semiconductor device, comprising:
    forming a fin structure protruding from a substrate;
    forming a shallow trench isolation (STI) region adjacent the fin structure, wherein the STI region has impurities having an impurity concentration gradient;
    forming a gate structure crossing the fin structure; and
    forming source/drain regions on opposite sides of the gate structure.

20. The method of claim 19, wherein the impurities comprise Si, N, He or a combination thereof.

* * * * *